US012604425B2

(12) United States Patent
Cho et al.

(10) Patent No.: US 12,604,425 B2
(45) Date of Patent: Apr. 14, 2026

(54) ELECTRONIC DEVICE INCLUDING LINK STRUCTURE AND CAPABLE OF SLIDING OPERATION

(71) Applicant: Samsung Electronics Co., Ltd., Suwon-si (KR)

(72) Inventors: Joongyeon Cho, Suwon-si (KR); Byounguk Yoon, Suwon-si (KR); Youngmin Kang, Suwon-si (KR); Moonchul Shin, Suwon-si (KR); Yeonggyu Yoon, Suwon-si (KR); Seungjoon Lee, Suwon-si (KR); Junyoung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 116 days.

(21) Appl. No.: 18/606,583

(22) Filed: Mar. 15, 2024

(65) Prior Publication Data

US 2024/0224448 A1     Jul. 4, 2024

Related U.S. Application Data

(63) Continuation of application No. PCT/KR2022/016382, filed on Oct. 25, 2022.

(30) Foreign Application Priority Data

Oct. 25, 2021     (KR) ........................ 10-2021-0142807

(51) Int. Cl.
*H05K 5/02* (2006.01)
(52) U.S. Cl.
CPC ................................. *H05K 5/0217* (2013.01)
(58) Field of Classification Search
CPC ... H05K 5/0217; G06F 1/1624; G06F 1/1652; G06F 1/1628; G09F 9/301
See application file for complete search history.

(56) References Cited

U.S. PATENT DOCUMENTS 6,360,105 B2     3/2002     Nakada et al.
9,519,313 B2     12/2016     Kim et al.
(Continued)

FOREIGN PATENT DOCUMENTS

CN     209731322 U     12/2019
CN     113099007 A     7/2021
(Continued)

OTHER PUBLICATIONS

International Search Report and written opinion dated Jan. 16, 2023, issued in International Patent Application No. PCT/KR2022/016382.

(Continued)

*Primary Examiner* — Sagar Shrestha
(74) *Attorney, Agent, or Firm* — Jefferson IP Law, LLP

(57) ABSTRACT

An electronic device is provided. The electronic device includes a first housing, a second housing slidably coupled to the first housing in a first direction, a flexible display of which at least a part is drawn into or taken out of an accommodation space of the electronic device according to sliding of the second housing, a support member sliding by means of the sliding of the second housing and supports the flexible display, and a link structure connecting the first housing, the second housing, and the support member where sliding of the second housing and sliding of the support member are interlinked. The link structure includes a link member, a first connection part for connecting the link member to the support member, a second connection part connecting the link member to the first housing, and a third connection part slidably or rotatably connecting the link member to the second housing.

14 Claims, 27 Drawing Sheets

(56) References Cited

U.S. PATENT DOCUMENTS

| | | | |
|---|---|---|---|
| 9,864,412 B2 * | 1/2018 | Park | G06F 1/1652 |
| 10,209,742 B2 | 2/2019 | Shn | |
| 10,499,515 B2 * | 12/2019 | Lee | H05K 5/0226 |
| 10,742,784 B1 | 8/2020 | Jo et al. | |
| 11,042,195 B1 | 6/2021 | Hong et al. | |
| 2010/0246113 A1 | 9/2010 | Visser et al. | |
| 2012/0314400 A1 | 12/2012 | Bohn et al. | |
| 2014/0247544 A1 | 9/2014 | Ryu | |
| 2016/0147261 A1 * | 5/2016 | Bohn | H10K 50/84 |
| | | | 455/566 |
| 2019/0387633 A1 | 12/2019 | Liao | |
| 2020/0135064 A1 * | 4/2020 | Lee | G06F 1/1684 |
| 2020/0348727 A1 | 11/2020 | Lee | |
| 2021/0034099 A1 | 2/2021 | Liao et al. | |
| 2021/0185835 A1 | 6/2021 | Song et al. | |
| 2021/0320992 A1 | 10/2021 | Song et al. | |

FOREIGN PATENT DOCUMENTS

| | | | |
|---|---|---|---|
| CN | 113411420 A | 9/2021 | |
| CN | 113741622 A | 12/2021 | |
| EP | 3893473 A1 | 10/2021 | |
| EP | 4 293 474 A1 | 12/2023 | |
| KR | 10-1227644 B1 | 1/2013 | |
| KR | 10-1472154 B1 | 12/2014 | |
| KR | 10-2017-0081559 A | 7/2017 | |
| KR | 10-2020-0124989 A | 11/2020 | |
| KR | 10-2022-0164285 A | 12/2022 | |
| WO | 2021/185096 A1 | 9/2021 | |

OTHER PUBLICATIONS

Extended European Search Report dated Nov. 22, 2024, issued in European Application No. 22887573.8-1113.

\* cited by examiner 1510                                    1510

322          321

ELECTRONIC DEVICE INCLUDING LINK STRUCTURE AND CAPABLE OF SLIDING OPERATION

CROSS-REFERENCE TO RELATED APPLICATION(S)

This application is a continuation application, claiming priority under § 365(c), of an International application No. PCT/KR2022/016382, filed on Oct. 25, 2022, which is based on and claims the benefit of a Korean patent application number 10-2021-0142807, filed on Oct. 25, 2021, in the Korean Intellectual Property Office, the disclosure of which is incorporated by reference herein in its entirety.

BACKGROUND

1. Field

The disclosure relates to an electronic device including a link structure and capable of sliding operation.

2. Description of Related Art

Due to the recent development of display technology, flexible displays are being launched into the market. By using such a flexible display, it is possible to implement a display in which a displayed screen size is variable. For example, electronic devices of a new concept including a display in which a screen size increases or decreases through sliding or a display which is transformed by being rolled around a specific mechanical structure or through folding are also being developed.

The above information is presented as background information only to assist with an understanding of the disclosure. No determination has been made, and no assertion is made, as to whether any of the above might be applicable as prior art with regard to the disclosure.

SUMMARY

A portion of a display may be moved into or moved out of an electronic device by relative movement of two mechanical structures.

The moving-in/out process of the display may not be performed smoothly due to excessive surface tension and frictional force acting on components that support the display while the display is moved in or moved out as described above.

When the moving-in/out process of the display is not performed smoothly, a portion of the display may be deformed in an unintended direction in some cases. For example, a portion of the display may rise.

According to various embodiments disclosed herein, operability in a moving-in/out operation of a display may be improved through a link member which assists the moving-in/out operation of a display.

Aspects of the disclosure are to address at least the above-mentioned problems and/or disadvantages and to provide at least the advantages described below. Accordingly, an aspect of the disclosure is to provide an electronic device including link structure and capable of sliding operation.

Additional aspects will be set forth in part in the description which follows and, in part, will be apparent from the description, or may be learned by practice of the presented embodiments.

In accordance with an aspect of the disclosure, an electronic device is provided. The electronic device includes a first housing, a second housing coupled to the first housing to be slidable in a first direction, a flexible display module at least a portion of which is moved into or moved out of an accommodation space in the electronic device following sliding of the second housing, a support member configured to support the flexible display module while being slid by the sliding of the second housing, and a link structure configured to connect the first housing, the second housing, and the support member such that the sliding of the second housing and the sliding of the support member are synchronized with each other. The link structure may include a link member, a first connection portion configured to connect the link member to the support member, a second connection portion configured to connect the link member to the first housing, and a third connection portion configured to connect the link member to the second housing to be slidable or rotatable.

In accordance with another aspect of the disclosure, an electronic device is provided. The electronic device includes a first housing, a second housing coupled to the first housing to be slidable in a first direction, a flexible display module at least a portion of which is moved into or moved out of an accommodation space in the electronic device following sliding of the second housing, a support member configured to support the flexible display module while sliding by a second distance corresponding to twice a first distance when the second housing slides by the first distance, and a link structure configured to connect the first housing, the second housing, and the support member such that the sliding of the second housing and the sliding of the support member are synchronized with each other. The link structure may include a link member, a first connection portion configured to connect the link member to the support member, a second connection portion configured to connect the link member to the first housing, and a third connection portion configured to connect the link member to the second housing to be slidable or rotatable. The link member may be configured such that the distance between a portion connected to the first connection portion and a portion connected to the third connection portion is substantially equal to the distance between a portion connected to the second connection portion and a portion connected to the third connection portion.

According to another aspect of the disclosure, an operation in which the display of the electronic device is moved into the electronic device through sliding can be smoothly performed, thereby reducing the occurrence of unintentional deformation of the display during the sliding operation.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the drawings, in which.

The same reference numerals are used to represent the same elements throughout the drawings.

DETAILED DESCRIPTION

Figure 1:
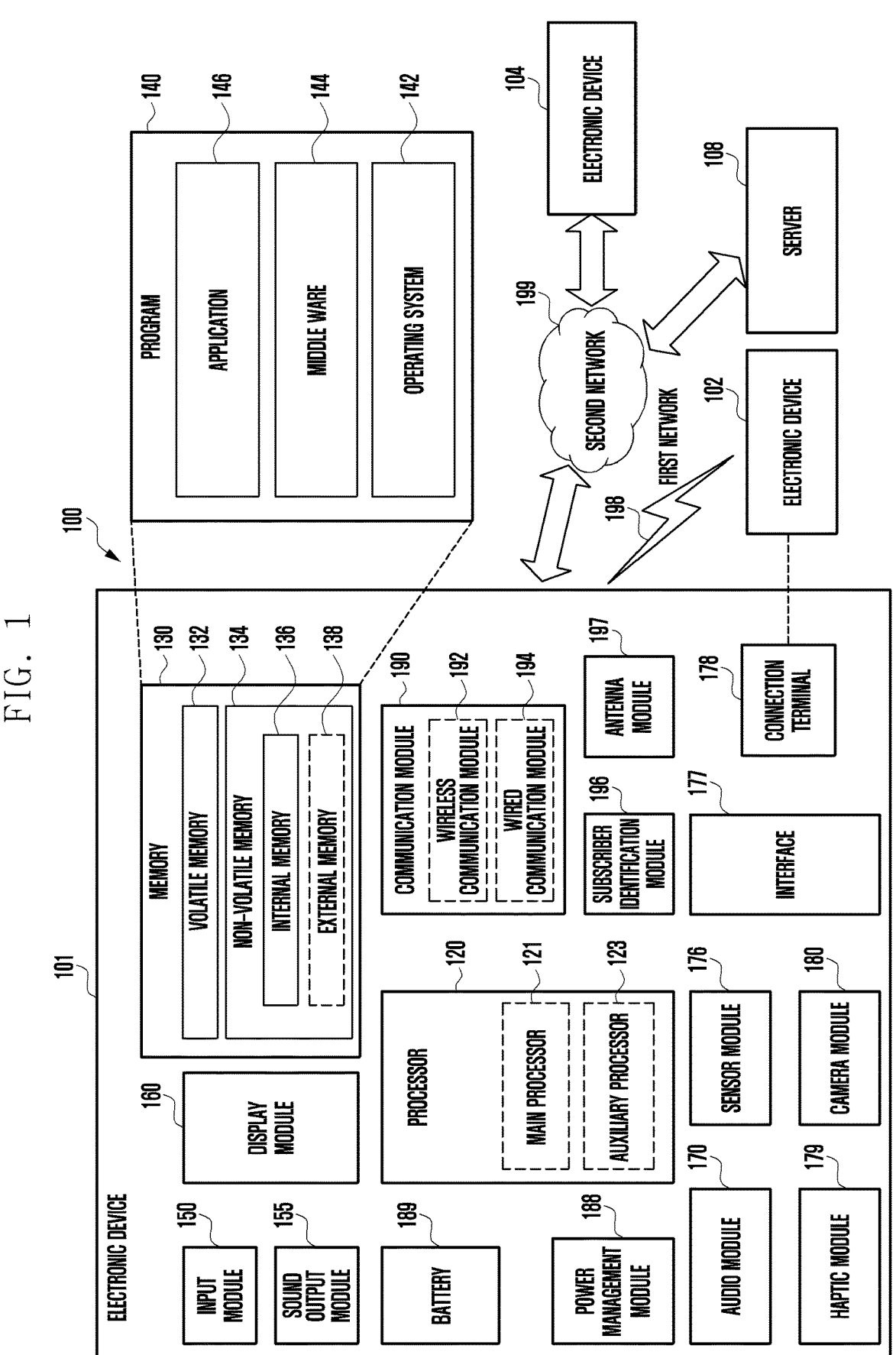
FIG. 1 is a block diagram of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It is to be understood that various embodiments disclosed herein and terms for describing the embodiments are not intended to limit the technical features disclosed herein to specific embodiments, and that the embodiments include various modifications, equivalents, and/or substitutions of the corresponding embodiments.

In connection with a description made with reference to the drawings, similar or related components may be denoted by similar reference numerals. The singular form of a noun corresponding to an item may include one item or a plurality of items unless the relevant context clearly dictates otherwise.

In the disclosure, each of phrases, such as "A or B", "at least one of A and B", "at least one of A or B", "A, B, or C", "at least one of A, B, and C", and "at least one of A, B, or C" may include one of the items listed together in the corresponding phrase or all possible combinations of the items. Terms such as "$1^{st}$", "$2^{nd}$", "first," and "second" may simply be used to distinguish a given component from other corresponding components and do not limit the corresponding components in other aspects (e.g., importance or order). When a certain (e.g., a first) component is mentioned as being "coupled" or "connected" to another (e.g., a second) component, with or without a term "functionally" or "communicatively", it means that the certain component may be connected to the other component directly (e.g., wiredly), wirelessly, or via a third component.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module(SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. The non-volatile memory 134 may include an internal memory 136 and an external memory 138. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a fifth-generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth-generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102 or 104, or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
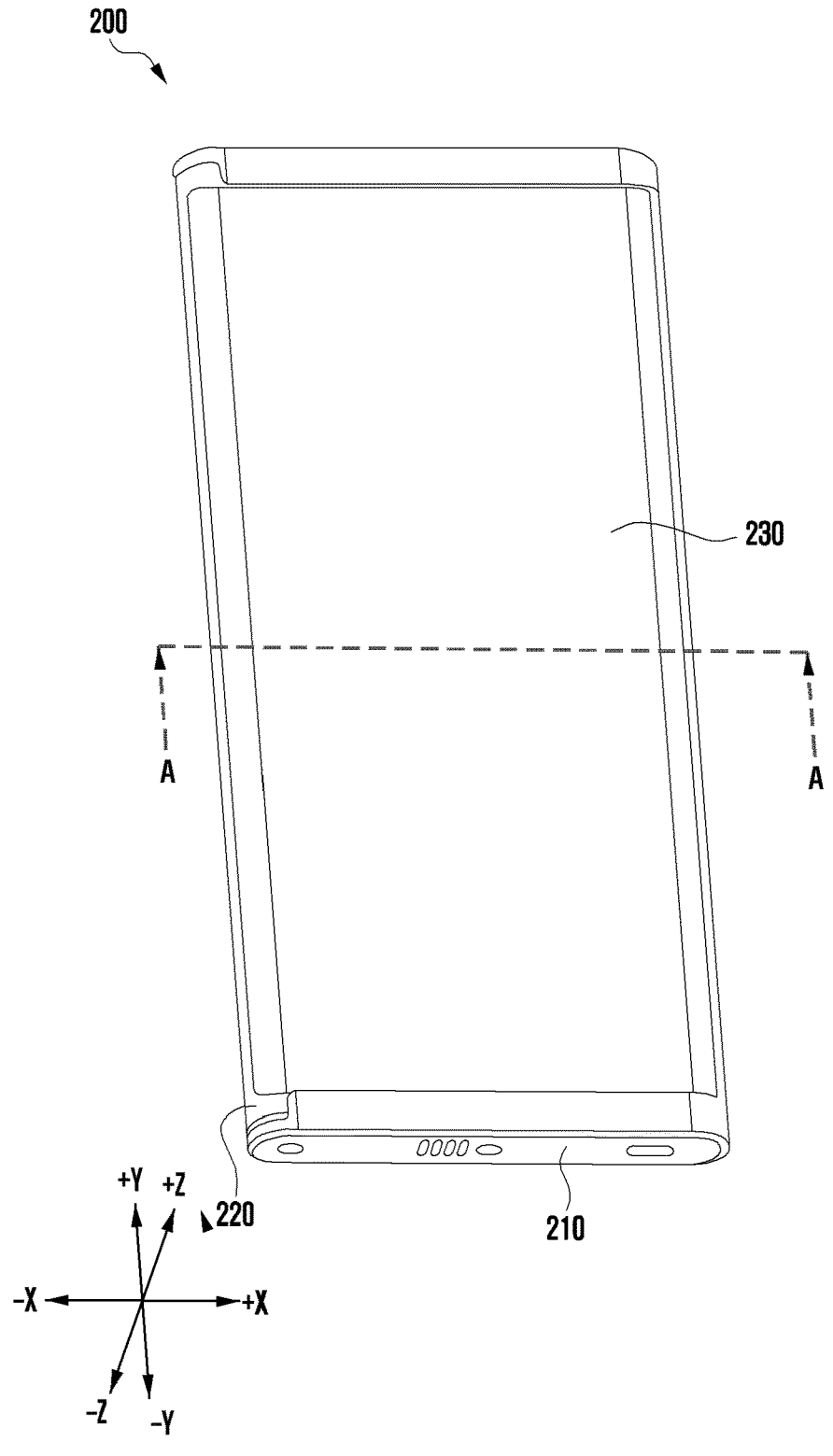
FIG. 2A is a perspective view of an electronic device disclosed herein in a closed state according to an embodiment of the disclosure.

FIG. 2A is a perspective view of an electronic device in a closed state according to an embodiment of the disclosure.

Figure 2B:
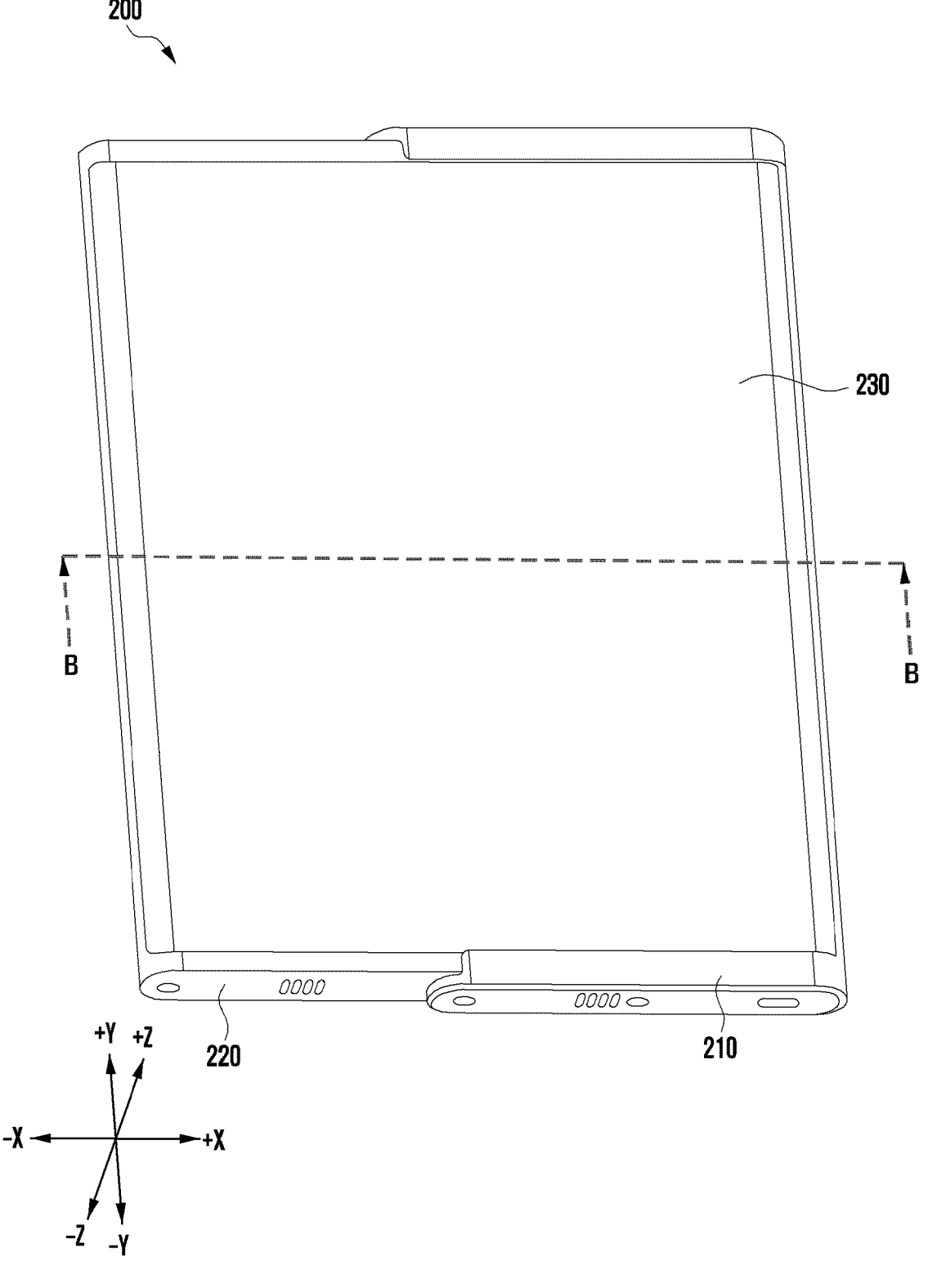
FIG. 2B is a perspective view of an electronic device disclosed herein in an open state according to an embodiment of the disclosure.

FIG. 2B is a perspective view of the electronic device in an open state according to an embodiment of the disclosure.

Figure 2C:
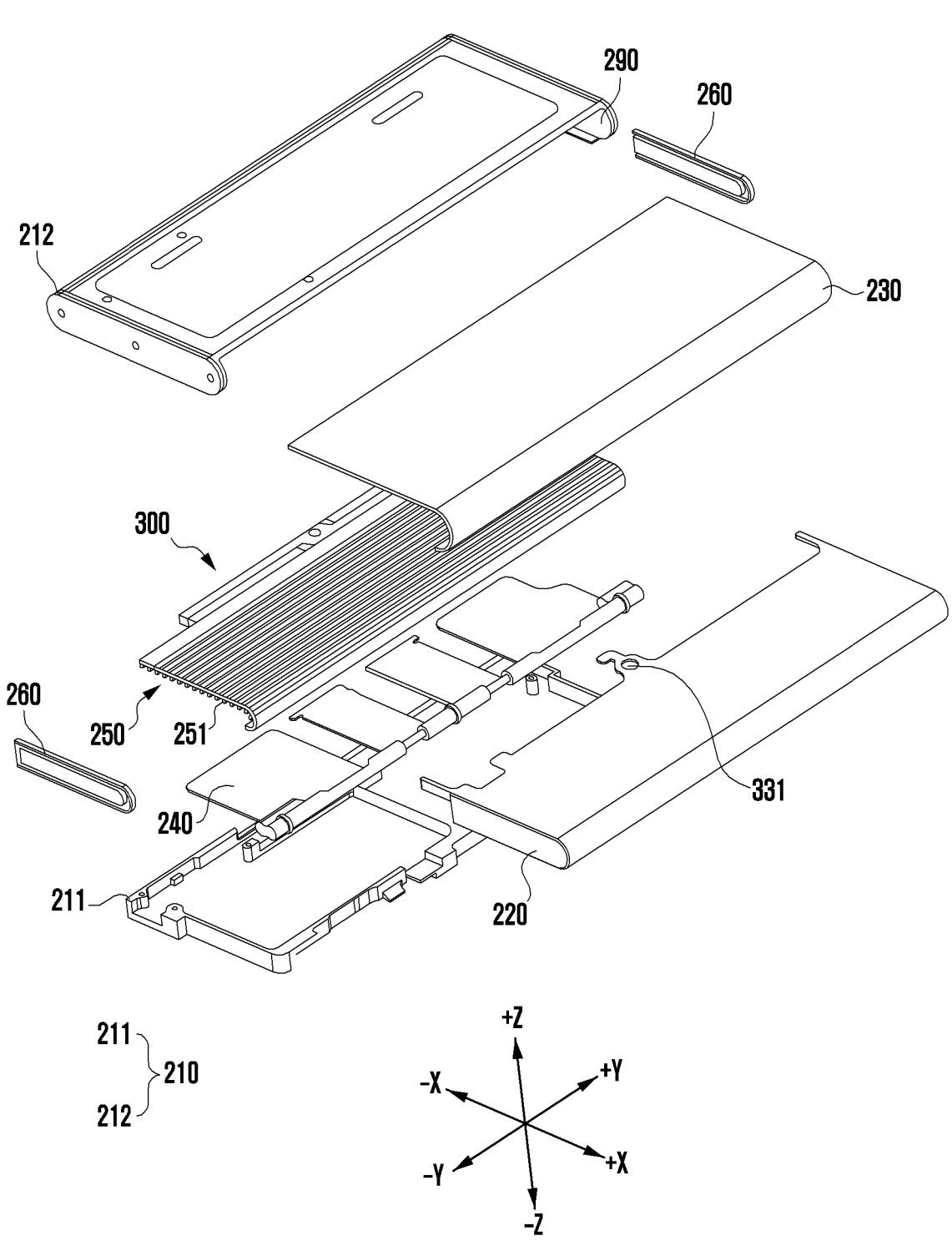
FIG. 2C is an exploded perspective view of the electronic device according to an embodiment of the disclosure.

FIG. 2C is an exploded perspective view of the electronic device according to an embodiment of the disclosure.

According to various embodiments, the electronic device 200 illustrated in FIGS. 2A to 2C may be one of the electronic devices 101 described with reference to FIG. 1. An electronic device described below may include at least one of the components described with reference to FIG. 1.

Referring to FIGS. 2A and 2B, the electronic device 200 may be a slidable electronic device 200. In an embodiment, the sliding operation of the electronic device 200 may mean sliding of the second housing 220 relative to the first housing 210. The second housing 220 may slide with respect to the first housing 210 to the +X direction with reference to FIGS. 2A and 2B or to the −X direction with reference to FIGS. 2A and 2B. In the following description, an operation in which the second housing 220 slides to the +X direction will be defined as a slide-in operation, and an operation in which the second housing 220 slides to the −X direction will be defined as a slide-out operation.

The electronic device 200 according to various embodiments disclosed herein is an electronic device 200 which is implemented such that the area of the flexible display module 230 visually exposed to the outside of the electronic device 200 is increased or decreased through a sliding method. In other words, the electronic device 200 may be an electronic device which is configured such that a portion of the flexible display module 230 is moved into or moved out of the electronic device 200 through a sliding method.

According to various embodiments, the flexible display module 230 may be a flexible display module 230 capable of being bent. In another embodiment, the flexible display module 230 may include a substrate made of a flexible material. For example, the flexible display module 230 includes a substrate made of a flexible polymer material such as polyimide (PI) or polyethylene terephthalate (PET). In addition, the flexible display module 230 may include a very thin substrate made of a glass material. The flexible display module 230 is supported by a support member 250, and depending on the sliding of the second housing 220 relative to the first housing 210, the area of the portion visible to the outside may be increased or decreased. In yet another embodiment, the flexible display module 230 may further include a touch detection circuit (e.g., a touch sensor). In addition, the flexible display module 230 may be coupled to or disposed adjacent to a pressure sensor capable of measuring the intensity (pressure) of a touch, and/or a digitizer configured to detect a magnetic field-type pen input device (e.g., a stylus pen). For example, the digitizer includes a coil member disposed on a dielectric substrate to detect an electromagnetically induced resonance frequency applied from a pen input device.

According to various embodiments, the electronic device 200 may be switched from a closed state (e.g., the state illustrated in FIG. 2A) to an open state (e.g., the state illustrated in FIG. 2B) by a sliding operation.

The closed state may mean the state in which the second housing 220 is completely slid in. The closed state may mean the state in which the second housing 220 is located at a position where the second housing can no longer be slid in. In the closed state, the ends of the first housing 210 and the ends of the second housing 220 may substantially coincide with each other. For example, as illustrated in FIG. 2A, the second housing 220 does not protrude from the first housing 210, or the first housing 210 does not protrude from the second housing 220.

The open state may mean a state in which the second housing 220 is completely slid out. The open state may mean the state in which the second housing 220 is located at a position where the second housing can no longer be slid out. The area of the flexible display module 230 that is visually exposed to the outside may be larger in the open state than in the closed state.

According to yet another embodiment, the sliding of the second housing 220 relative to the first housing 210 may be performed semi-automatically. For example, the sliding of the second housing 220 relative to the first housing 210 is performed by a member (not illustrated) providing an elastic force in the sliding direction. In this case, when the second housing 220 is partially slid relative to the first housing 210, the second housing 220 may be slid by an elastic force applied to the first housing 210 and/or the second housing 220.

According to yet another embodiment, the sliding of the second housing 220 relative to the first housing 210 may be performed automatically. For example, the second housing 220 slides relative to the first housing 210 by a motor (not illustrated). A motor, which slides the second housing 220, may operate in response to signals input through various buttons and sensors included in the electronic device 200.

According to various embodiments, the first housing 210 may include a plurality of housings. Since the second housing 220 is slid relative to the first housing 210, it may be understood that the second housing 220 is slid relative to a plurality of housings included in the first housing 210. The plurality of housings included in the first housing 210 may include, for example, a front surface housing 211 providing a portion of the front surface of the electronic device 200 (e.g., the surface facing the +Z direction in FIG. 2A) and a rear surface housing 212 providing a portion of a rear surface of the electronic device 200 (e.g., the surface facing the −Z direction of FIG. 2A). A rear surface cover (not illustrated) may be coupled to the rear surface housing 212. The rear surface cover may be made of a transparent, opaque, or translucent material. A portion of the second housing 220 may be accommodated in a space defined by the plurality of housings included in the first housing 210. The components of the first housing 210 illustrated in FIG. 2C are just examples, and the first housing 210 may be configured as a single housing or may include a larger number of housings than those illustrated in FIG. 2C.

According to various embodiments, the second housing 220 may be slid relative to the first housing 210. Referring to FIGS. 2A and 2C, a portion of the second housing 220 may be inserted into a sliding groove 290 in the first housing 210 to allow the sliding of the second housing 220 to be guided. The support housing 240 may be coupled to the second housing 220. The supporting housing 240 may be a housing that supports the support member 250 which supports the flexible display module 230. An accommodation space (e.g., the accommodation space 280 in FIGS. 3A and 3B) may be defined between the support housing 240 and the second housing 220 by the coupling of the support housing 240 and the second housing 220. Following the sliding of the second housing 220, a portion of the flexible display module 230 may be accommodated in the accommodation space provided between the second housing 220 and the support housing 240. In some embodiments, the second housing 220 and the support housing 240 may be integrated with each other.

According to various embodiments, the support member 250 may support a portion of the flexible display module 230. The support member 250 may include a bendable structure. For example, the support member 250 includes a structure in which multiple bars 251 extending in a direction (e.g., the Y-axis direction in FIG. 2C) perpendicular to the sliding direction (e.g., the X-axis direction in FIG. 2C) are arranged along the sliding direction. In addition, the support member 250 may be configured in various other bendable structures. For example, the support member 250 is a bendable plate or may have a structure in which a plurality of grooves are formed to allow bending.

According to various embodiments, the support member 250 may support the flexible display module 230 while being slid following the sliding of the second housing 220. The sliding of the support member 250 may be guided by guide rails 260. For example, by inserting both ends of the multiple bars 251 included in the support member 250 into the guide rails 260, respectively, the sliding of the support member 250 is guided. The guide rails 260, which guide the support member 250, may be coupled to the second housing 220. For example, as illustrated in FIG. 2C, the guide rails 260 is coupled to both ends of the second housing 220, and the support member 250 may be disposed between the guide rails 260.

According to various embodiments, a link structure 300 may be a component that converts some of the force for sliding the second housing 220 relative to the first housing 210 (e.g., a force provided by a user or a force provided by a motor) into a driving force for sliding the support member 250. The link structure 300 may connect the second housing 220 to the support member 250 such that the sliding of the second housing 220 and the sliding of the support member 250 are synchronized with each other. The link structure 300 will be described in detail later.

Figure 3A:
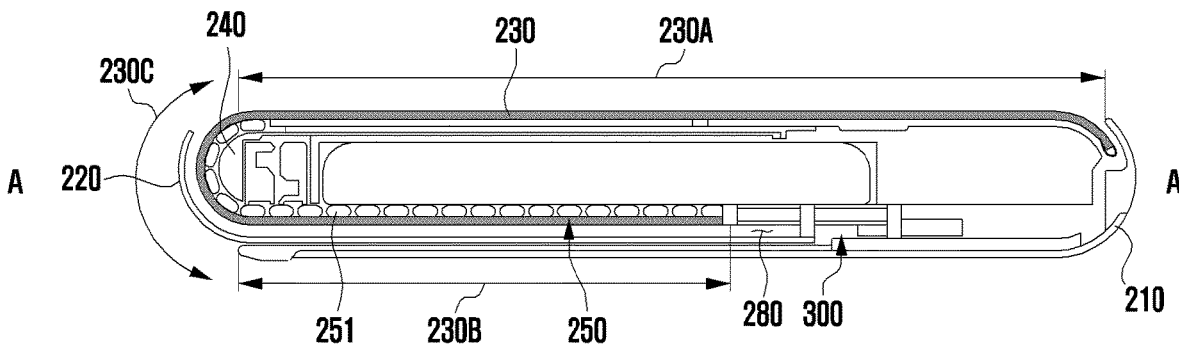
FIG. 3A is a cross-sectional view taken along line A-A of the electronic device illustrated in FIG. 2A, according to an embodiment of the disclosure.
Figure 3A:
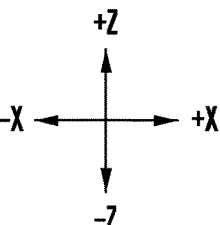

FIG. 3A is a cross-sectional view taken along line A-A of the electronic device illustrated in FIG. 2A, according to an embodiment of the disclosure.

Figure 3B:
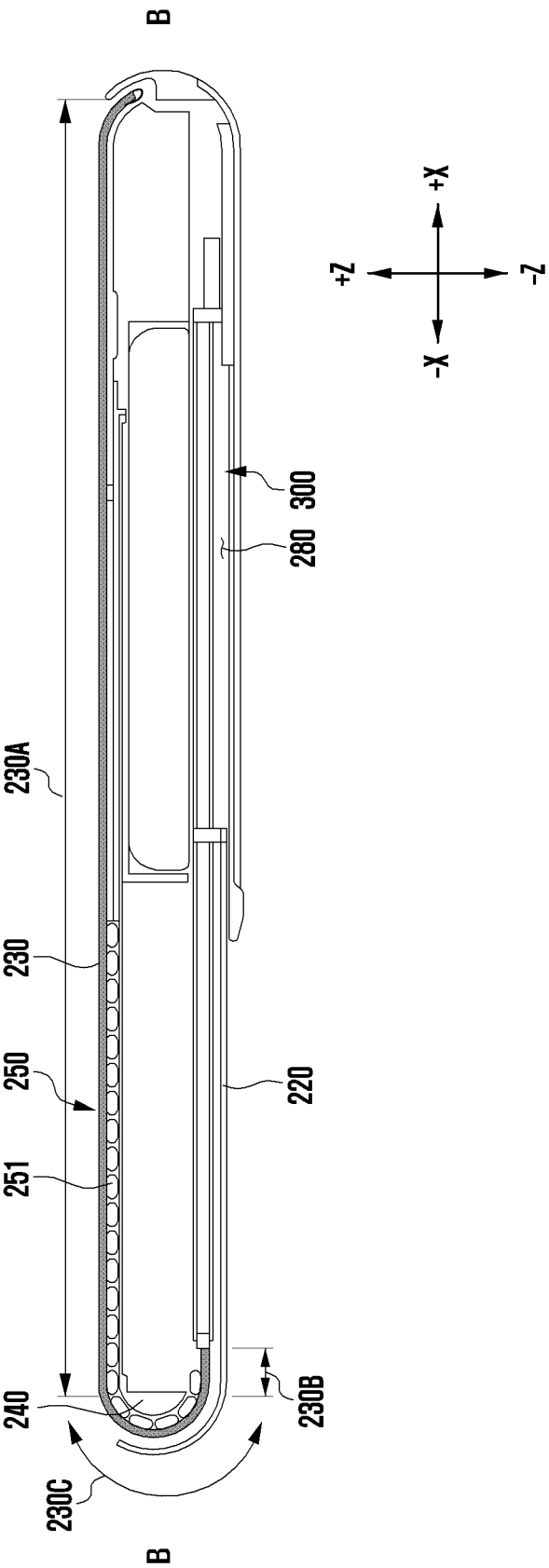
FIG. 3B is a cross-sectional view taken along line B-B of the electronic device illustrated in FIG. 2B, according to an embodiment of the disclosure.

FIG. 3B is a cross-sectional view taken along line B-B of the electronic device illustrated in FIG. 2B, according to an embodiment of the disclosure.

Referring to FIGS. 3A and 3B, the flexible display module 230 may include a plurality of areas. The plurality of areas described below may be areas divided depending on the state of the flexible display module 230 or the portion where the flexible display module 230 is located in the electronic device 200. For example, the flexible display module 230 includes a first area 230A, which is an area where the flexible display module 230 is visually exposed to the outside of the electronic device 200, a second area 230B, which is an area where the flexible display module 230 is accommodated in the accommodation space in the electronic device 200, and a third area 230C, which is a deformed (e.g., bent) area interconnecting the first area 230A and the second area 230B. In an embodiment, the second area 230B of the flexible display module 230 may be an area in which a portion of the flexible display module 230 is accommodated in the accommodation space 280. The accommodation space

280 may be a space surrounded by various mechanical elements of the electronic device 200. In another embodiment, the accommodation space 280 may include an area defined by the second housing 220 and the support housing (e.g., the support housing 240 in FIG. 2C). In yet another embodiment, depending on the shape of the housing surrounding the flexible display module 230, a portion of the third area 230C may also be visible to the outside of the electronic device 200. For example, as illustrated in FIGS. 3A and 3B, a portion of the second housing 220 covers the bent area. Accordingly, a portion of the third area 230C that is not covered by the second housing 220 may also be exposed to the outside of the electronic device 200. Each area of the flexible display module 230 described above is only divided for convenience of description, and may not be an actually visually distinct area.

In yet another embodiment, the third area 230C may be an area in which a portion of the flexible display module 230 is deformed to correspond to the outer shape of the second housing 220. For example, as illustrated in FIGS. 3A and 3B, the outer shape of the second housing 220 partially includes a round shape. The third area 230C may be an area in which a portion of the flexible display module 230 is bent to correspond to the round shape of the second housing 220.

In yet another embodiment, the flexible display module 230 may be supported by the support member 250. The sliding of the support member 250 may be guided by guide rails 260. The support member 250 may include multiple bars 251 extending in a direction perpendicular to the sliding direction (e.g., the X-axis direction of FIG. 3A) of the flexible display module 230 and arranged along the sliding direction. Both ends of the multiple bars 251 may be inserted into the guide rails 260. Therefore, the multiple bars 251 may be slid along the direction where the guide rails 260 are provided. The guide rails 260 may be provided to correspond to the round shape of the second housing 220 to allow the support member 250 to support the third area 230C, and the support member 250 may be bent along the guide rails 260 corresponding to the round shape. For example, when the support member 250 includes the multiple bars 251, in the portion where the third area 230C is supported, the distance between adjacent ones of the multiple bars 251 are increased compared to that in the portion where the first area 230A or the second area 230B of the flexible display module 230 is supported, and the support member 250 may be bent as a whole. The support member 250 may support the third area 230C of the flexible display module 230 in the state of being bent along the guide rails 260.

Depending on the sliding in the electronic device 200, the sizes of the first area 230A and the second area 230B may variable. For example, the size of the first area 230A in the closed state (e.g., the state illustrated in FIG. 2A) is smaller than the size of the first area 230A in the open state (e.g., the state illustrated in FIG. 2B). The size of the second area 230B in the closed state may be larger than the size of the second area 230B in the open state.

According to various embodiments, when the second housing 220 is slid out, the flexible display module 230 supported by the support member 250 may be slid, the first area 230A may be increased, and the second area 230B may be decreased.

According to various embodiments, when the second housing 220 is slid in, the flexible display module 230 supported by the support member 250 may be slid, the first area 230A may be decreased, and the second area 230B may be increased.

As such, in the electronic device 200 according to various embodiments disclosed herein, a portion of the flexible display module 230 is moved into or moved out of the accommodation space 280, and the area of the flexible display module 230 seen from the outside of the electronic device 200 may be increased or decreased. Various operations such as adjusting the amount of displayed information or adjusting the aspect ratio of a displayed content screen may be performed depending on the change in the area of the flexible display module 230 seen from the outside.

In yet another embodiment, when the electronic device 200 is in the slide-out state as illustrated in FIG. 3B, the link structure 300 may occupy the space that has been occupied by the flexible display module 230 and the support member 250. Since this space is occupied by the flexible display module 230 and the support member 250 in the slide-in state, other components have not been originally disposed in this space. Since the link structure 300 is disposed in the space left empty for the disposition of the flexible display module 230 and the support member 250, even if the link structure 300 is disposed, the component disposition space of the electronic device 200 may not be significantly reduced.

Figure 4:
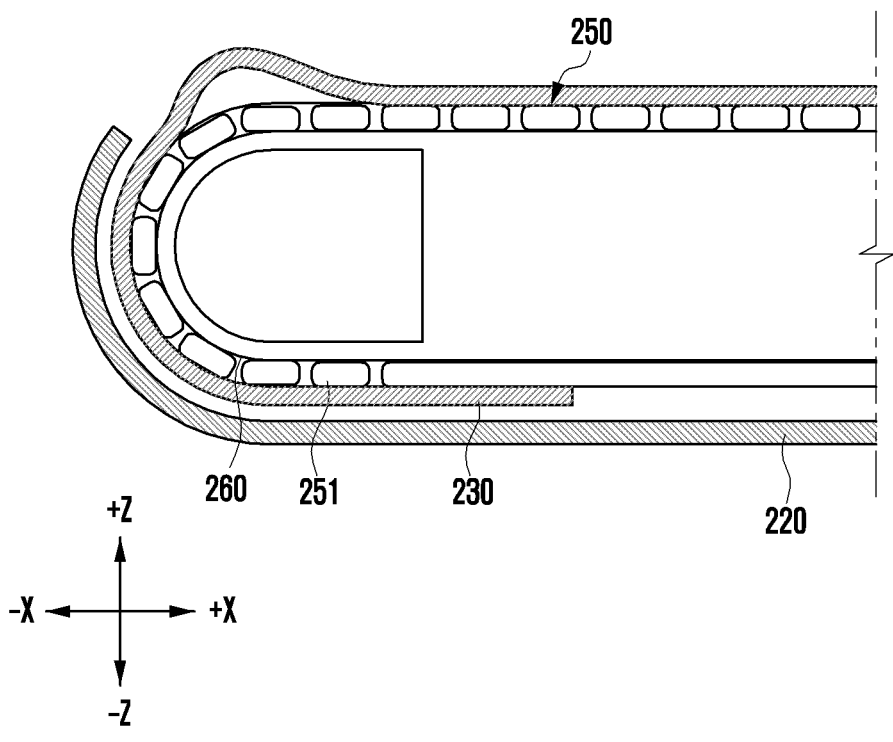
FIG. 4 is a view illustrating a problem that may occur in the process of sliding of the flexible display module according to an embodiment of the disclosure.

FIG. 4 is a view illustrating a problem that may occur in the process of sliding of the flexible display module according to an embodiment of the disclosure.

Referring to FIG. 4, in the process in which the housings 210, 220 of the electronic device is slid, the force for sliding the housing 210, 220 (e.g., the force provided by a user or the force provided by a motor of the electronic device) and the frictional force between the support member 250 and the guide rails 260 may be proportional to each other. The vertical drag force between the guide rails 260 and the support member 250 may be increased due to the force provided for sliding, and hence the frictional force between the support member 250 and the guide rails 260 may be increased. Since the support member 250 is slid along the guide rails 260, the increase in frictional force between the support member 250 and the guide rails 260 may act as a factor obstructing the sliding of the support member 250. When the frictional force between the support member 250 and the guide rails 260 exceeds a certain level, the sliding of the support member 250 does not proceed, and hence stress may be increased between the support member 250 and the flexible display module 230 supported on the support member 250. When the engagement between the support member 250 and the flexible display module 230 is released due to this stress, as illustrated in FIG. 4, a phenomenon in which the flexible display module 230 rises in one direction may occur. For example, when the support member 250 and the flexible display module 230 are bonded and fixed by a bonding member (not shown), the fixation by the bonding is released, and the flexible display module 230 is deformed at an unintended position. In some cases, the central portions of the multiple bars 251 included in the support member 250 may be deformed, and the flexible display module 230 may be deformed, resulting in the occurrence of a lifting phenomenon. Since both ends of the multiple bars 251 are fixed to the guide rails 260, the central portions of the multiple bars 251 may be convexly bent to one direction (e.g., the +Z direction in FIG. 4). As a result, the lifting phenomenon in which a portion of the flexible display module 230 supported by the multi-bar 251 rises convexly to a specific direction (e.g., the +Z direction of FIG. 4) compared to other portions may occur.

Figure 5A:
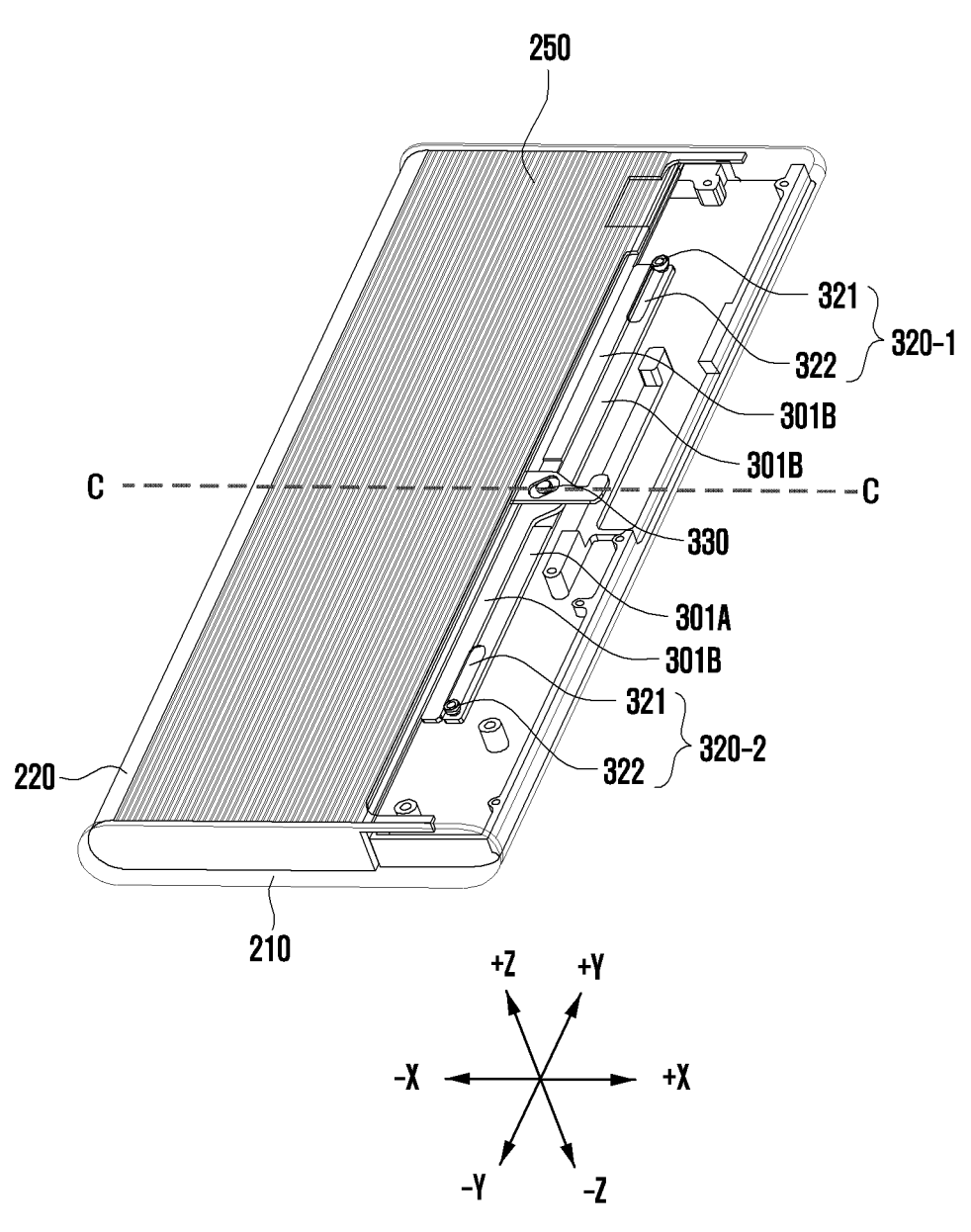
FIGS. 5A, 5B and 5C are views illustrating an operation of a link member according to various embodiments of the disclosure.
Figure 5B:
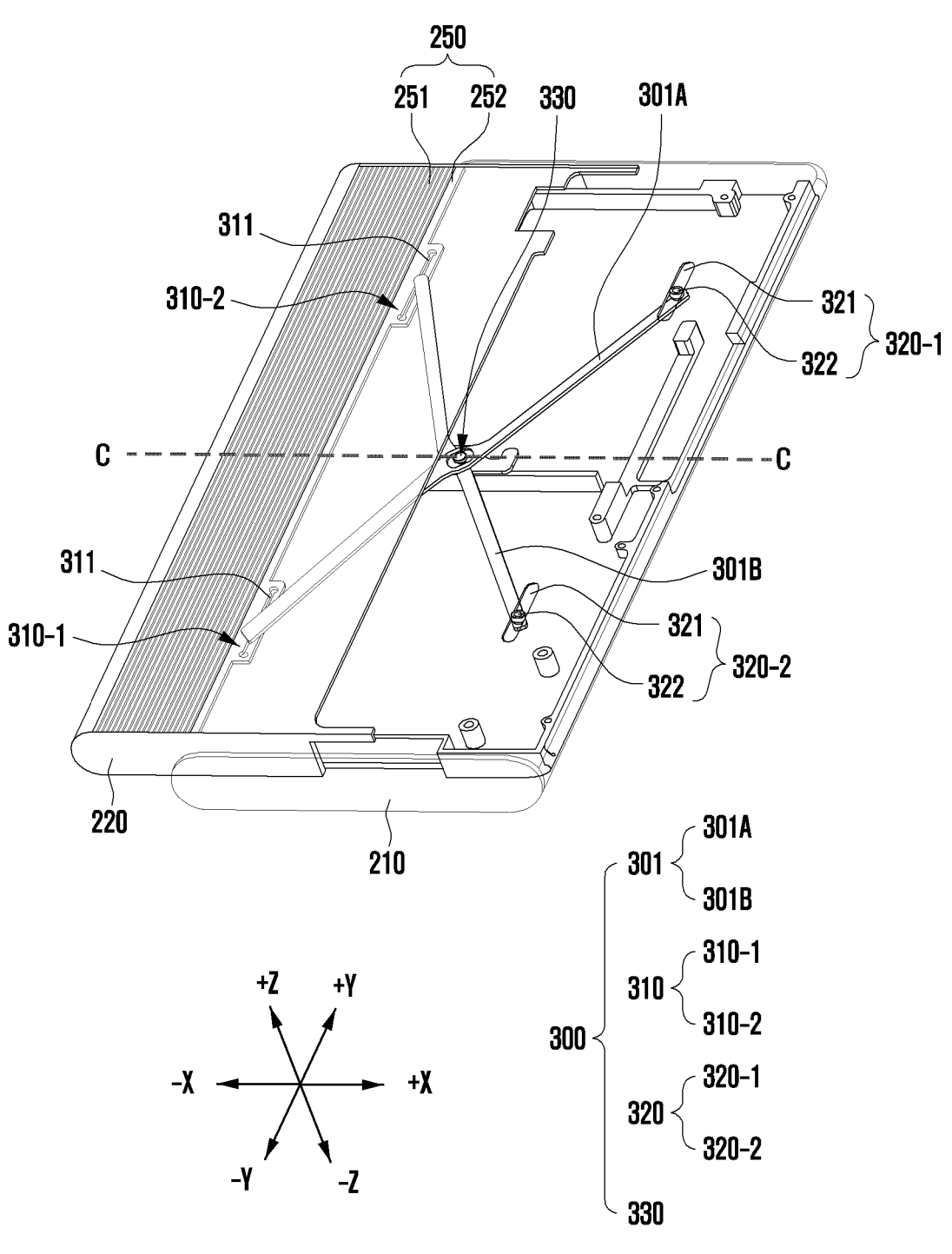
Figure 5C:
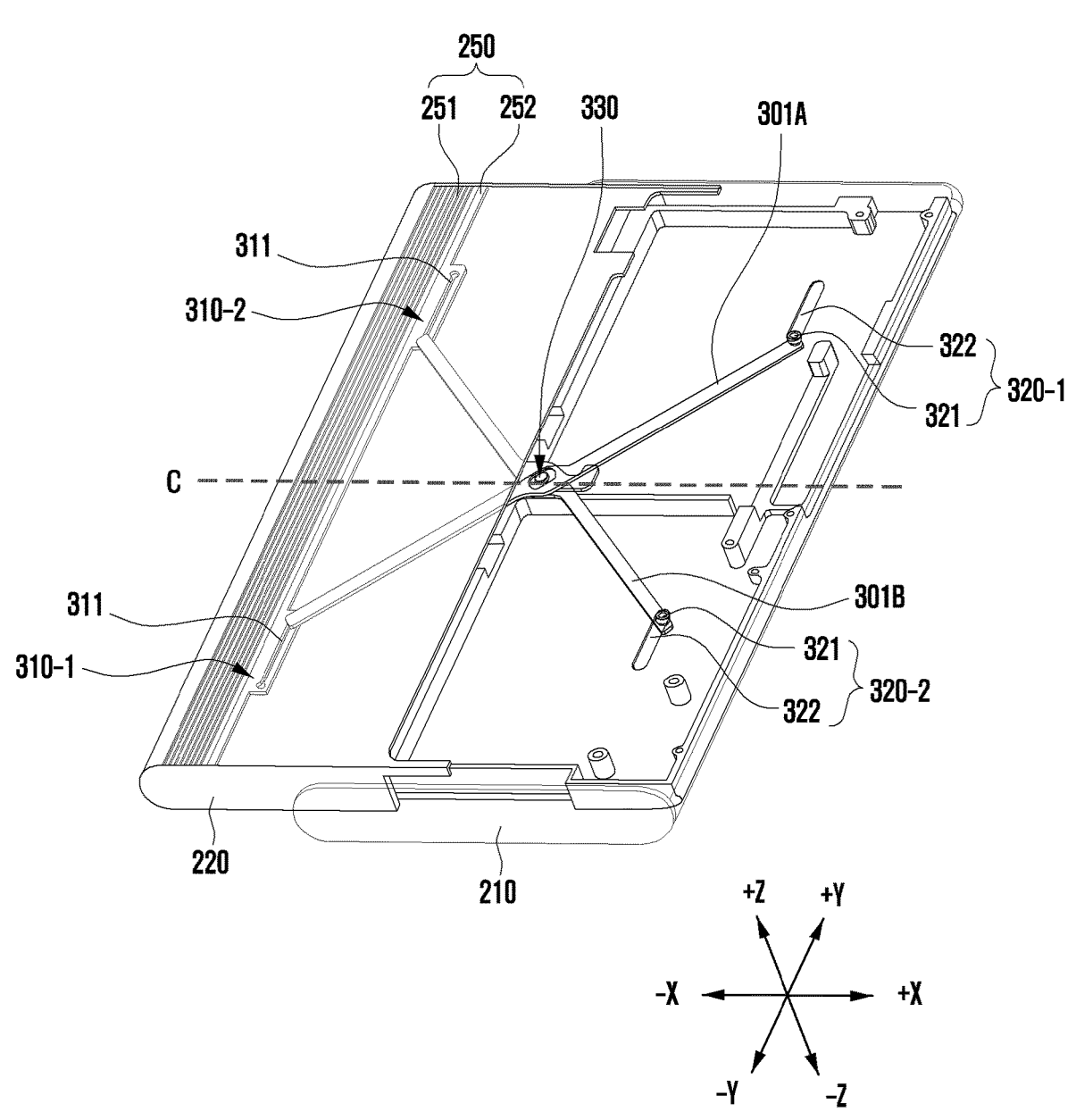

FIGS. 5A to 5C are views illustrating the operation of a link member according to various embodiments of the disclosure.

Figure 6:
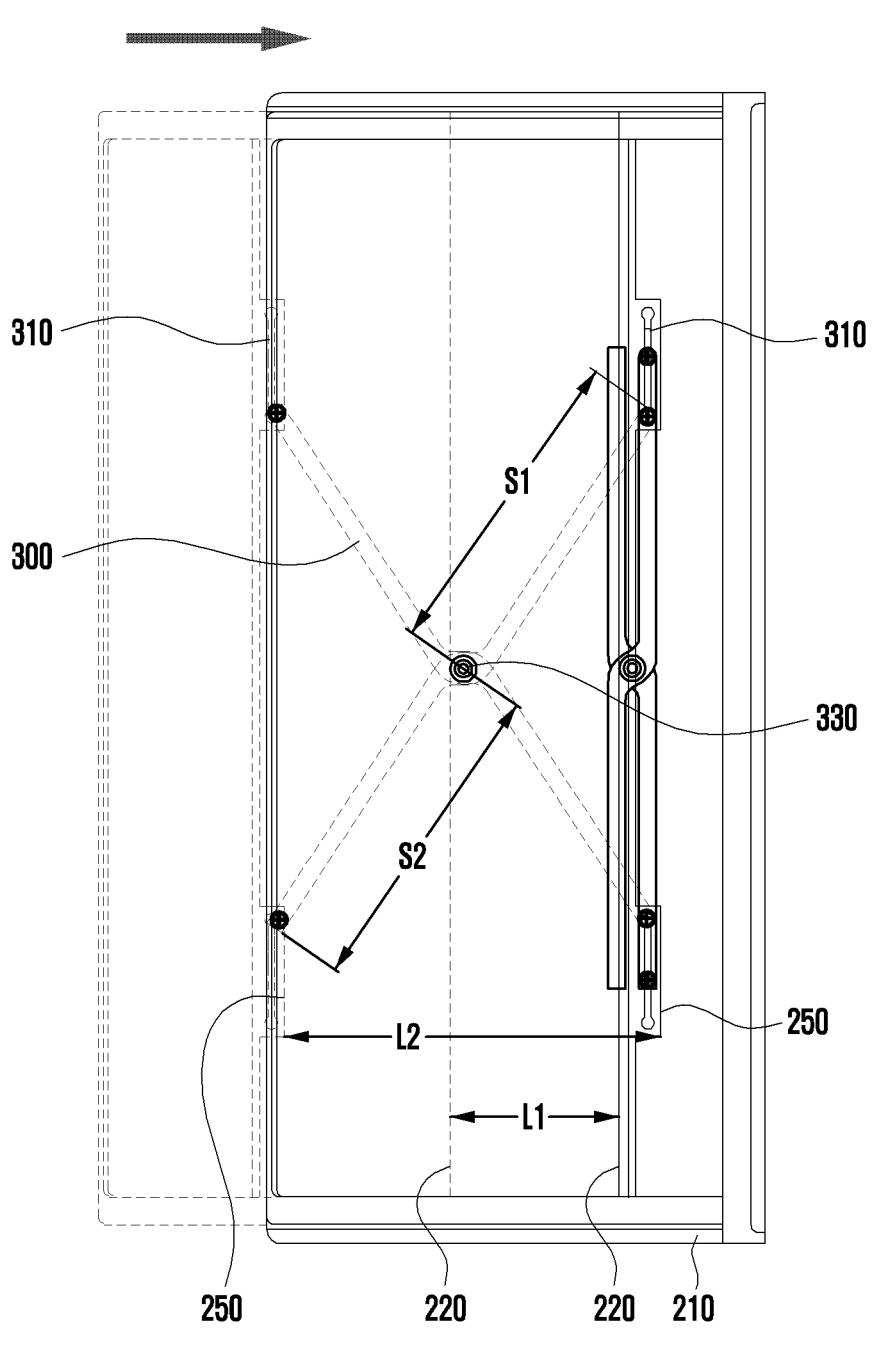
FIG. 6 is a view illustrating a shape of a link member and a distance relationship among mechanical elements moving in a sliding process according to an embodiment of the disclosure.

FIG. 6 is a view illustrating the shape of a link member and a distance relationship among mechanical elements moving in a sliding process according to an embodiment of the disclosure.

Figure 7:
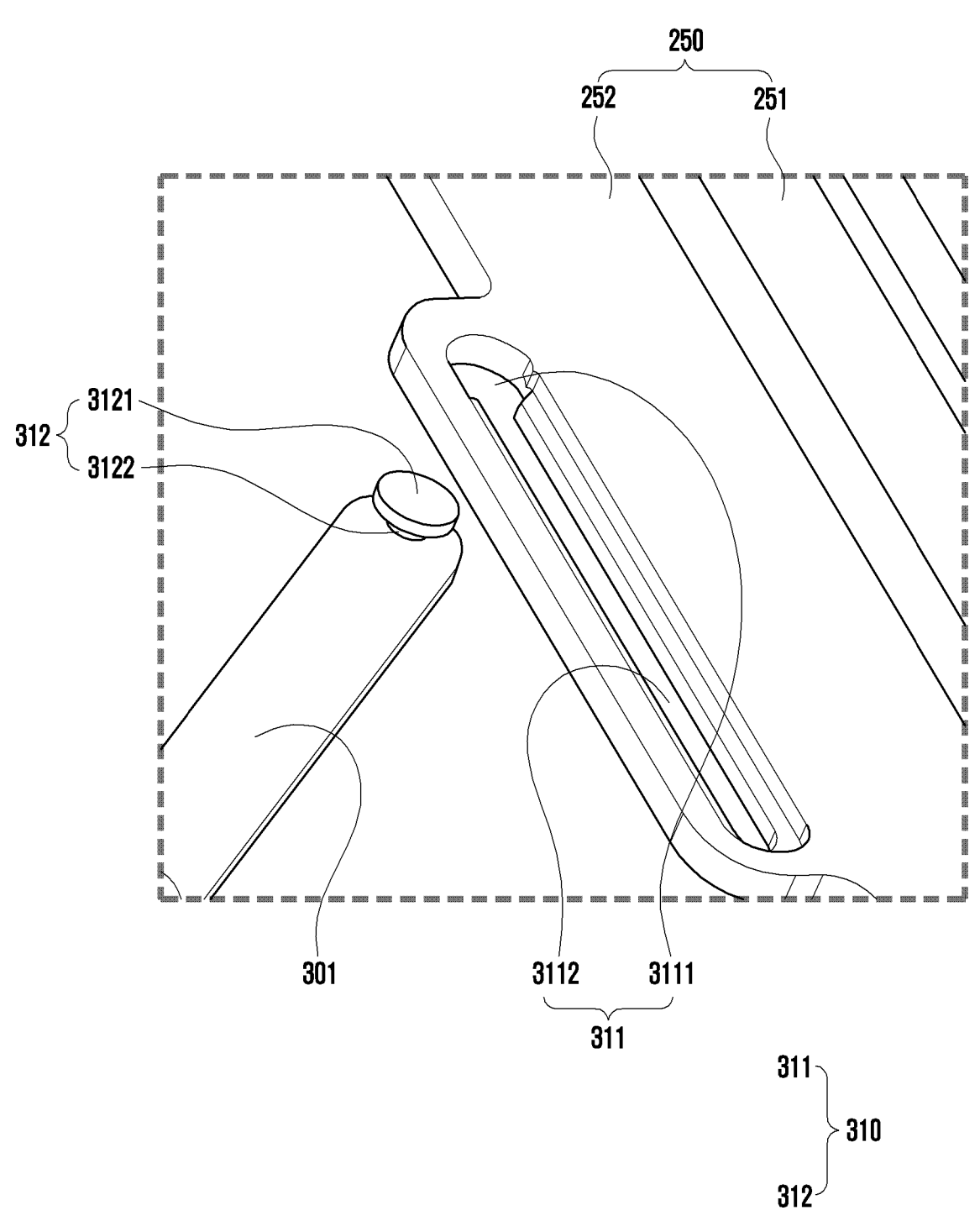
FIG. 7 is a view illustrating a first connection portion according to an embodiment of the disclosure.

FIG. 7 is a view illustrating a first connection portion according to an embodiment of the disclosure.

Figure 8A:
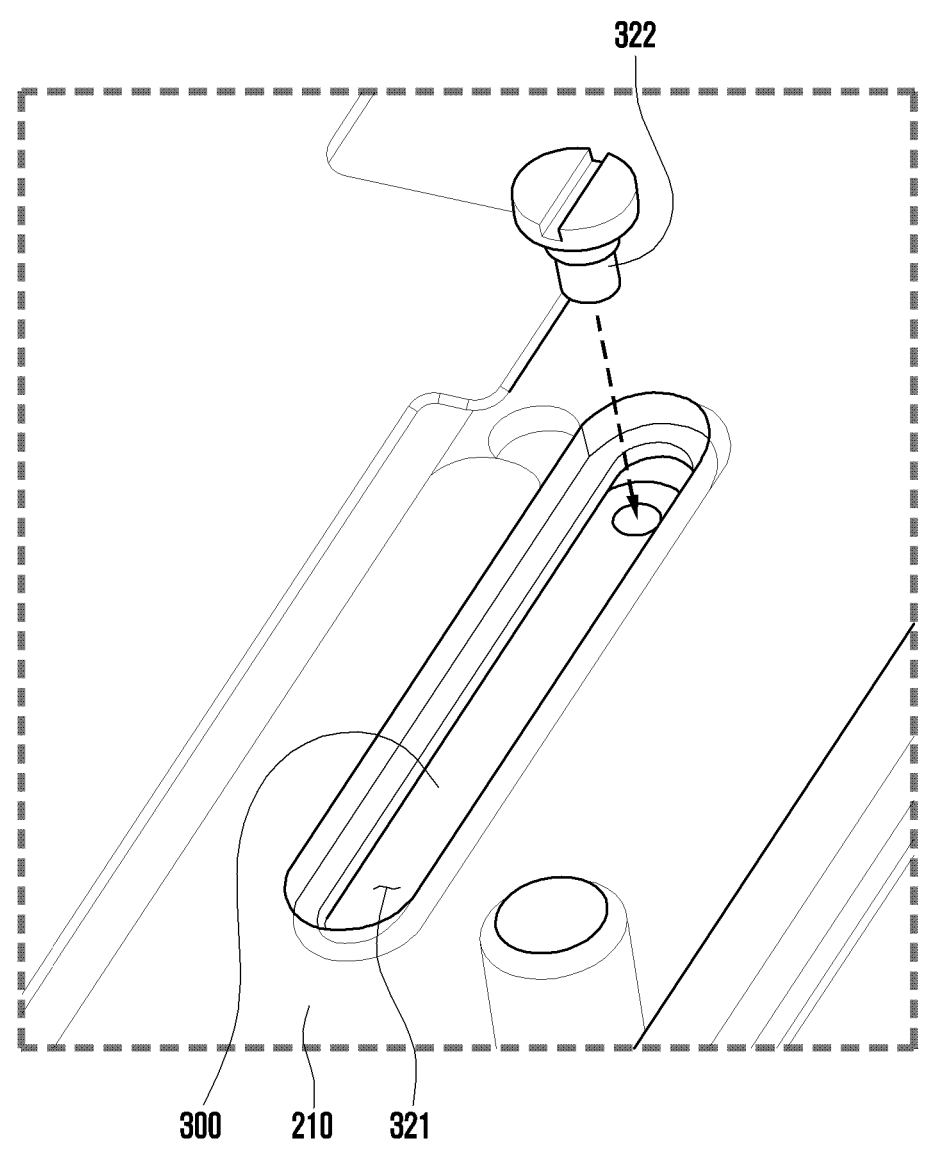
FIGS. 8A and 8B are views illustrating second connection portions according to various embodiments of the disclosure.
Figure 8B:
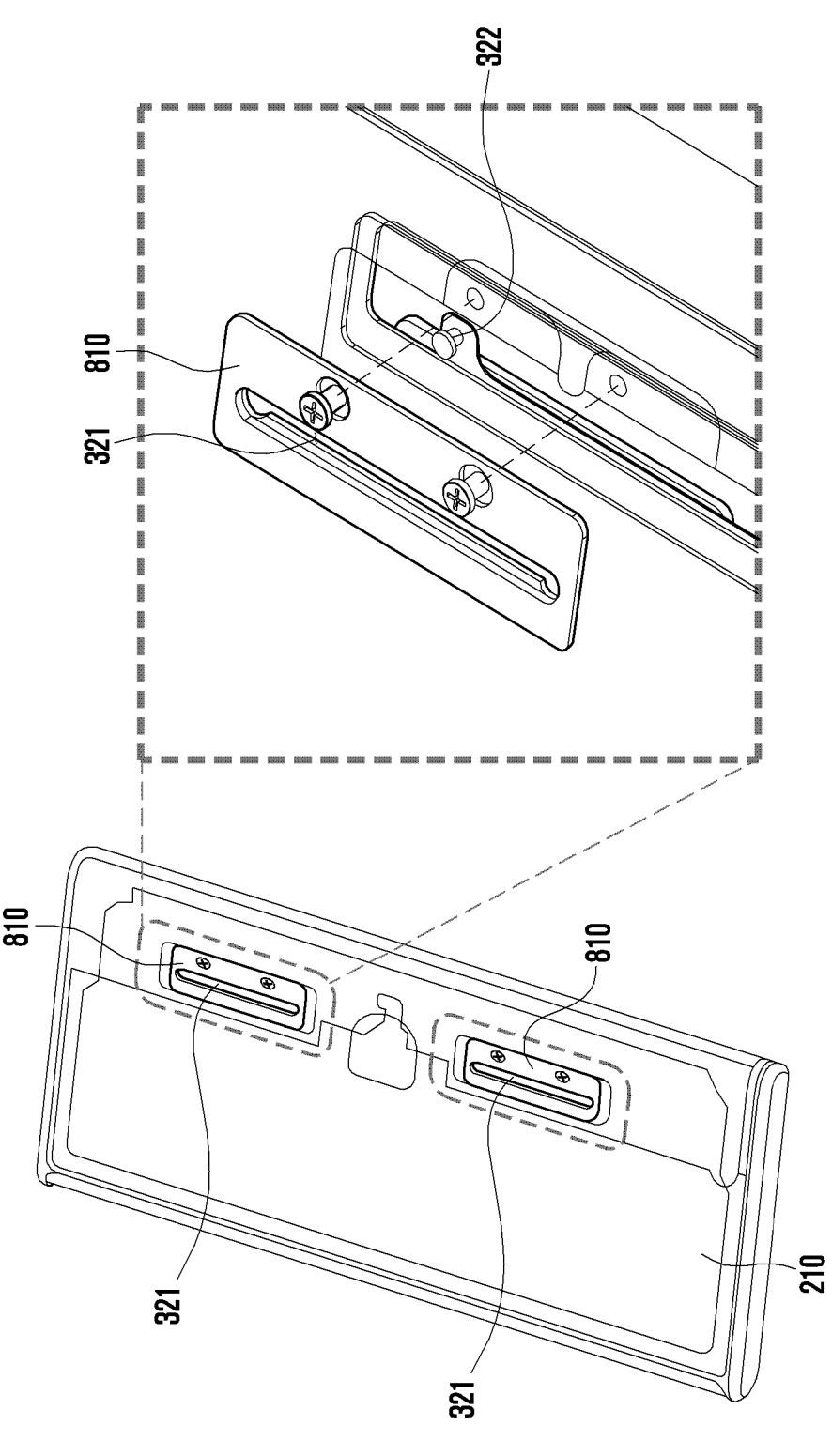

FIGS. 8A and 8B are views illustrating second connection portions according to various embodiments of the disclosure.

Figure 9:
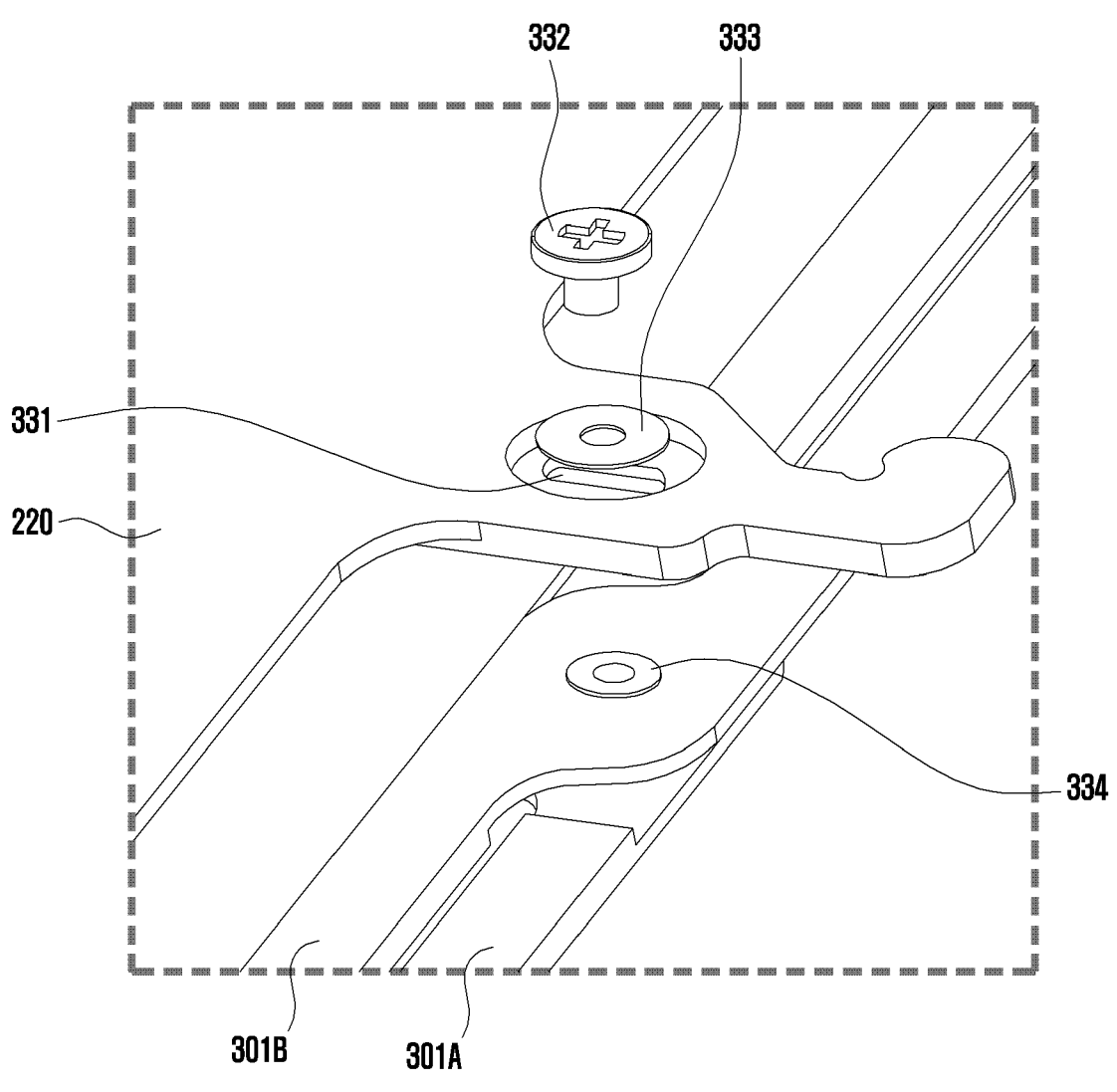
FIG. 9 is a view illustrating a third connection portion according to an embodiment of the disclosure.

FIG. 9 is a view illustrating a third connection portion according to an embodiment of the disclosure.

In the following description, for convenience of description, the flexible display module 230 may be omitted from the drawings. In addition, it may be understood that some drawings illustrate internal components of the electronic device 200 in a perspective representation. For example, the link structure 300 is a component disposed inside the electronic device 200.

In various embodiments disclosed herein, since some of the force applied to the electronic device 200 for sliding is converted into a driving force for sliding the support member 250, it is possible to reduce the vertical drag acting between the guide rails 260 and the support member 250 and hence the frictional force between the guide rails 260 and the support member 250. Therefore, since the support member 250 is capable of smoothly sliding along the guide rails 260, it is possible to solve or reduce the above-described problems.

According to various embodiments, the link structure 300 is capable of converting some of the force applied to the electronic device 200 for sliding into a driving force for sliding the support member 250. In addition, the link structure 300 may connect the second housing 220 to the support member 250 such that the sliding of the second housing 220 and the sliding of the support member 250 are synchronized with each other.

In an embodiment, the link structure 300 may include a link member 301, a first connection portion 310, a second connection portion 320, and a third connection portion 330.

The link member 301 may extend in one direction. For example, the link member 301 is configured to elongate as illustrate in FIGS. 5A to 5C. The link member 301 may be connected to components (e.g., the first housing 210, the second housing 220, and the support member 250) included in the electronic device 200 to be slidable or rotatable by the first connection portion 310, the second connection portion 320, or the third connection portion 330.

In another embodiment, a plurality of link members 301 may be provided. For example, as illustrated in FIGS. 5A to 5C, the link member 301 includes a first link member 301A and a second link member 301B. The first link member 301A and the second link member 301B may be disposed to cross each other.

According to various embodiments, the first connection portion 310 may be a component of connecting the link member 301 to the support member 250, the second connection portion 320 may be a component of connecting the link member 301 to the first housing 210, and the third connection portion 330 may be a component of connecting the link member 301 to the second housing 220. Here, the connection portions 310, 320, and 330 may be understood as components including components that connect the link member 301 to other mechanical elements to be rotatable or slidable.

In an embodiment, the first connection portion 310 may include a $(1-1)^{th}$ connection portion 310-1 and a $(1-2)^{th}$ connection portion 310-2. The $(1-1)^{th}$ connection portion 310-1 may connect the first link member 301A to the support member 250, and the $(1-2)^{th}$ connection portion 310-2 may connect the second link member 301B to the support member 250. Referring to FIGS. 5A to 5C, the $(1-1)^{th}$ connection portion 310-1 and the $(1-2)^{th}$ connection portion 310-2 may be disposed at different positions. For example, with respect to the central axis C of the electronic device 200 that is parallel to the first direction, which is the sliding direction of the second housing 220, the $(1-1)^{th}$ connection portion 310-1 is disposed in a third direction (e.g., the −Y direction in FIG. 5A), and the $(1-2)^{th}$ connection portion 310-2 may be disposed in a fourth direction (e.g., the +Y direction in FIG. 5A) opposite to the third direction. In yet another embodiment, the $(1-1)^{th}$ connection portion 310-1 and the $(1-2)^{th}$ connection portion 310-2 may be disposed symmetrically with respect to the central axis C.

In yet another embodiment, the second connection portion 320 may include a $(2-1)^{th}$ connection portion 320-1 and a $(2-2)^{th}$ connection portion 320-2. The $(2-1)^{th}$ connection portion 320-1 may connect the first link member 301A to the first housing 210, and the $(2-2)^{th}$ connection portion 320-2 may connect the second link member 301B to the first housing 210. Referring to FIGS. 5A to 5C, the $(2-2)^{th}$ connection portion 320-1 and the $(2-2)^{th}$ connection portion 320-2 may be disposed at different positions. For example, with respect to the central axis C of the electronic device 200, the $(2-1)^{th}$ connection portion 320-1 is disposed in a fourth direction (e.g., the +Y direction in FIG. 5A), and $(2-2)^{th}$ connection portion 320-2 may be disposed in a third direction (e.g., the −Y direction in FIG. 5A) opposite to the fourth direction. In an embodiment, the $(2-1)^{th}$ connection portion 320-1 and the $(2-2)^{th}$ connection portion 320-2 are disposed symmetrically with respect to the central axis C.

In yet another embodiment, the third connection portion 330 may connect each of the first link member 301A and the second link member 301B to the second housing 220. Referring to FIGS. 5A and 5B, at a point where the first link member 301A and the second link member 301B cross each other, the third connection portion 330 connects the first link member 301A and the second link member 301B to the second housing 220. For example, the first link member 301A and the second link member 301B are rotatably connected to each other by the third connection portion 330 and each are rotatably connected to the second housing 220 by the third connection portion 330. In some embodiments, a component that rotatably connects the first link member 301A to the second link member 301B and a component that connects the first link member 301A and the second link member 301B to the second housing 220 may be the same or different.

Referring to FIGS. 5A to 5C and FIG. 7, in an embodiment, the first connection portion 310 may include a first slide rail 311 and a first slider 312. The first slide rail 311 may be a rail provided in a second direction (e.g., the Y-axis direction in FIGS. 5A to 5C) perpendicular to the first direction (e.g., the X-axis direction in FIGS. 5A to 5C) which is the sliding direction of the second housing 220. The first slider 312 may be inserted into the first slide rail 311 and may slide along the first slide rail 311. The first slider 312 may be slid in the second direction along the direction in which the first slide rail 311 is provided. The first slider 312 may be coupled to one end of the link member 301. For example, the first slider 312 is coupled to the link member 301 to the one end of the link member 301 by various methods, such as bolt coupling, rivet coupling, and/or welding coupling. In some embodiments, the first slider 312 may be integrated with the link member 301. For example, the first slider 312 includes a protrusion protruding from the one end of the link member 301. The one end of the link member 301 may be coupled to the first slider 312 and may be slid along the first slide rail 311.

In yet another embodiment, the first slide rail 311 may be provided in the support member 250. The first slide rail 311 may be provided at an end of the support member 250 so that the end of the support member 250 and the link member 301 may be connected to each other. For example, as illustrated in FIGS. 5A to 5C and 7, when the support member 250 includes multiple bars 251 separated from each other, the slide rail 311 is provided on an end bar 252 corresponding to the last bar among the multiple bars 251. The end bar 252 may be, for example, a portion supporting the end of the second area (e.g., the second area 230B in FIG. 3A) of the flexible display module 230. In yet another embodiment, the end bar 252 on which the first slide rail 311 is provided may have higher strength than other bars 251 of the support member 250. For example, the end bar 252 is made of a material having high strength, or the end bar 252 may be thicker than other bars 251.

As illustrated in FIG. 7, the first slider 312 may include a first portion 3121 and a second portion 3122 which have different widths. The first portion 3121 of the first slider 312 may be inserted into the first slide rail 311. An inlet portion 3111 of the first slide rail 311 is wider than the first portion 3121 of the first slider 312 such that the first portion 3121 of the first slider 312 can be inserted into the first slide rail 311 through the inlet portion 3111. The second portion 3122 of the first slider 312 may have a relatively smaller width than the first portion 3121. After the first slider 312 is inserted into the first slide rail 311, the first slider 312 may be slid in the rail portion 3112 of the first slide rail 311 having a width corresponding to that of the second portion 3122 of the first slider 312. At this time, since the first portion 3121 of the first slider 312 has a larger width than the rail portion 3112 of the first slide rail 311, it is possible to prevent the first slider 312 from being disengaged from the first slide rail 311 while being slid in the rail portion 3112 of the first slide rail 311. The structures of the first slider 312 and the first slide rail 311 described with reference to FIG. 7 are only examples, and various other structures that allow the first slider 312 to slide along the first slide rail 311 without being disengaged may be applied.

According to various embodiments, the second connection portion 320 may include a second slide rail 321 and a second slider 322. The second slide rail 321 may be a slide rail provided in a second direction perpendicular to the sliding direction in the electronic device. The second slider 322 may be inserted into the second slide rail 321 and may slide along the second slide rail 321. The second slider 322 may be slid in the second direction along the direction in which the second slide rail 321 is provided. The second slider 322 may be coupled to the other end of the link member 301. For example, the second slider 322 is coupled to the link member 301 to the other end of the link member 301 by various methods, such as bolt coupling, rivet coupling, and/or welding coupling. In some embodiments, the second slider 322 may be integrated with the link member 301. For example, the second slider 322 includes a protrusion protruding from the other end of the link member 301. The other end of the link member 301 may be coupled to the second slider 322 and may be slid along the second slide rail 321.

Referring to FIG. 8A, the second slide rail 321 may be provided in the first housing 210. For example, the second slide rail 321 is provided in the first housing 210 in an opening shape. The link structure 300 may be slidably coupled to the second slide rail 321 by the second slider 322 that passes through the second slide rail 321 and is bolted to the other end of the link structure 300.

Referring to FIG. 8B, in some embodiments, the second slide rail 321 may be provided in a connection bracket 810 which is provided separately from the first housing 210. The connection bracket 810 may be made of a material different from that of the first housing 210. The connection bracket 810 may be made of a material having higher strength than the first housing 210. For example, the connection bracket 810 is made of a metal material having higher strength than the first housing 210. In this way, when the second slide rail 321 is provided in the connection bracket 810 made of a material different from that of the first housing 210, the durability of the second slide rail 321 may be improved. When the connection bracket 810 is made of a material with high strength, the connection bracket 810 may be fabricated to have a small thickness. Accordingly, it is possible to fabricate the electronic device slimmer. In an embodiment, both ends of the second slide rail 321 provided in the connection bracket 810 may have a larger width than other portions. The second slider 322 may be inserted into one of both ends of the second slide rail 321.

According to various embodiments, as illustrated in FIG. 9, the third connection portion 330 may include a connection hole 331, a bolt member 332, a washer 333, and/or a nut member 334. In an embodiment, the connection hole 331 may be disposed on the central axis C of the electronic device 200. Referring to FIG. 9, the first link member 301A and the second link member 301B may be simultaneously connected to the connection hole 331 provided in the second housing 220. For example, as illustrated in FIG. 9, when the bolt member 332 is inserted into the connection hole 331 provided in the second housing 220 and passes through the first link member 301A and the second link member 301B, the first link member 301A and the second link member 301B may be rotatably connected to each other, and the first link member 301A and the second link member 301B may be connected to the second housing 220 at the same position by the third connection portion 330. For example, as illustrated in FIGS. 5A to 5C, the first link member 301A and the second link member 301B are connected to the second housing 220 at a point where the first link member 301A and the second link member 301B cross each other. Referring to FIG. 9, by inserting the nut member 334 into a hole provided in the middle portions of the first link member 301A and the second link member 301B, and bolding the bolt member 332 to the nut member 334 through the washer 333 and the connection hole 331, the first link member 301A and the second link member 301B may be rotatably connected to the connection hole 331. According to various embodiments, the bolt member 332 may include a bolt and/or a rivet. For example, when the bolt member 332 is a rivet, the nut member 334 is not used.

When a force for slide-in of the electronic device 200 is applied, some of the force may be transmitted to the support member 250 by the first link member 301A and the second link member 301B. Referring to FIGS. 5A to 5C, when the third connection portion 330 is slid in the slide-in direction by the force applied to the second housing 220, the first slider 312 may be slid in the second direction along the first slide rail 311 following the sliding of the third connection portion 330, and the second slider 322 may be slid in the second direction along the second slide rail 321. In this process, the first connection portion 310 and the second connection portion 320 may approach to each other. Since the second connection portion 320 is a portion disposed in a housing (the first housing 210) relatively fixed with respect to the movable second housing 220, the first connection portion 310 and the second connection portion 320 may approach to each other as the first connection portion 310 approaches to the second connection portion 320. Since the first connection portion 310 is provided in the support member 250, approaching of the first connection portion 310 to the second connection portion 320 may mean that the support member 250 supporting the flexible display module 230 is slid in the slide-in direction. As described above, some of the force applied for sliding in the electronic device 200 may be converted into a driving force for sliding the support member 250 in the slide-in direction. Depending on the operation of the link structure 300, a force capable of overcoming the frictional force applied due to the normal drag acting between the support member 250 and the guide rails 260 guiding the support member 250 may be provided to prevent the flexible display from rising as described above with reference to FIG. 4.

Meanwhile, referring to FIG. 6, in various embodiments disclosed herein, when the second housing 220 is slid with respect to the first housing 210 by a first distance L1, the support member 250 may be slid by a second distance L2 in the same direction. In this case, the second distance L2 may be twice the first distance L1. While the second housing 220 is slid by the first distance L1, the support member 250 is moved by the first distance L1 in the portion that supports the first area (e.g., the first area 230A in FIG. 3A), and the support member 250 is moved by the first distance L1 in the portion that supports the second area (e.g., the second area 230B in FIG. 3A). Thus, the support member 250 is capable of moving by the second distance L2, which is twice the first distance L1. According to various embodiments, the link structure 300 may provide a driving force corresponding to a difference in moving distance between the second housing 220 and the support member 250.

Referring to FIG. 6, the distance between one end of the link member 301 connected to the first connection portion 310 and a portion of the link member 301 connected to the third connection portion 330 (S1) and the distance between the other end of the link member 301 connected to the second connection portion 320 and a portion of the link member 301 connected to the third connection portion 330 (S2) are equal to each other. Therefore, when the third connection portion 330 including the connection hole 331 provided in the second housing 220 moves by the first distance L1, the one end of the link member 301 connected to the first connection portion 310 is capable of moving by the second distance L2 that is twice the first distance L1. The third connection portion 330 is a component connecting the second housing 220 to the link member 301, and the first connection portion 310 is a portion connecting the support member 250 to the link member 301. When the second housing 220 is slid by the first distance L1, the portion of the link member 301 connected to the second housing 220 by the third connection portion 330 is also capable of moving by the first distance L1. Due to the distance relationship of the link member 301, the one end where the link member 301 is connected to the first connection portion 310 including the first slide rail 311 formed in the support member 250 is capable of moving by the second distance L2 that is twice the first distance L1. This coincides with the relationship between the moving distance of the second housing 220 and the moving distance of the support member 250 during the sliding process. Since the driving force provided by the link structure 300 to the support member 250 corresponds to the moving distance relationship between the second housing 220 and the support member 250, the driving force provided by the link structure 300 to the support member 250 as the second housing 220 moves may be synchronized with the sliding distance of the second housing 220 and the sliding distance of the support member 250.

In the following description, detailed descriptions of components identical to those described above will be omitted.

Figure 10:
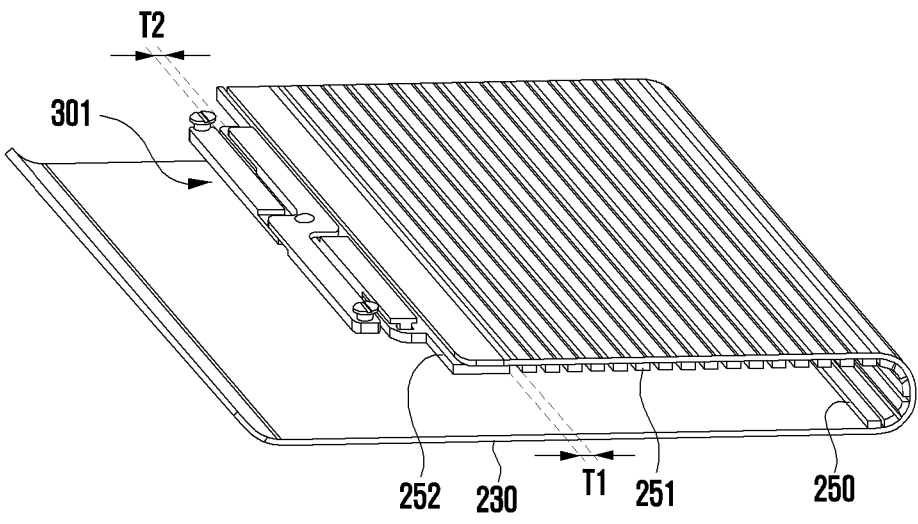
FIG. 10 is a perspective view of a support member and a link member in a coupled state according to an embodiment of the disclosure.

FIG. 10 is a perspective view of a support member and a link member in a coupled state according to an embodiment of the disclosure.

Figure 11:
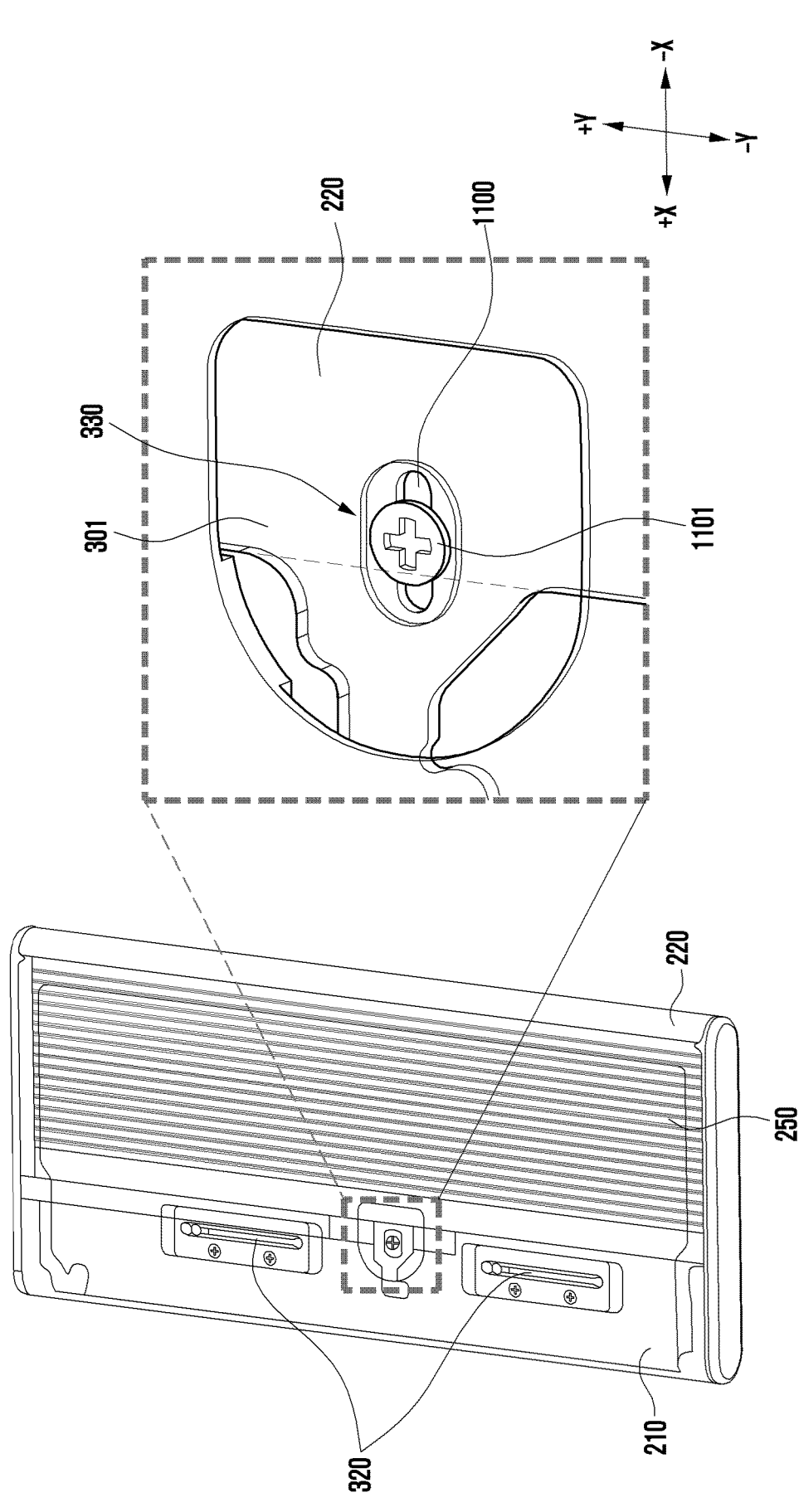
FIG. 11 is a view illustrating a third connection portion including an adjustment hole according to an embodiment of the disclosure.

FIG. 11 is a view illustrating a third connection portion including an adjustment hole according to an embodiment of the disclosure.

Referring to FIG. 10, the third connection portion 330 may include an adjustment hole 1100. The adjustment hole 1100 may be a hole provided in the second housing 220. The link member 301 may be rotatably connected to the adjustment hole 1100.

Referring to FIG. 11, the adjustment hole 1100 may be a hole extending in a first direction (e.g., the X-axis direction in FIG. 11) which is the sliding direction in the electronic device 200. Accordingly, a position where the link member 301 is connected to the adjustment hole 1100 may be adjusted in the first direction.

During the assembly process of the link member 301, an assembly deviation may occur. For example, referring to FIG. 10, various deviation generating factors, such as a difference in the distance between the end bar 252 of the support member 250 connected to the link member 301 and another bar 251 of the support member 250 (T1) and a difference in the distance between the first link member 301A and the second link member 301B (T2) may exist. The aforementioned deviations may be eliminated by adjusting, via the adjustment hole 1100, the position where the link structure 300 is connected to the second housing 220.

Referring to FIG. 11, in a state in which the electronic device 200 is placed in the closed state and a preset force is applied to the flexible display module (e.g., the flexible display module 230 in FIG. 2A), it is possible to adjust the position of the link structure 300 via the adjustment hole 1100 and to fix the link structure 300 by the bolt member 1101 at the adjusted position.

Figure 12A:
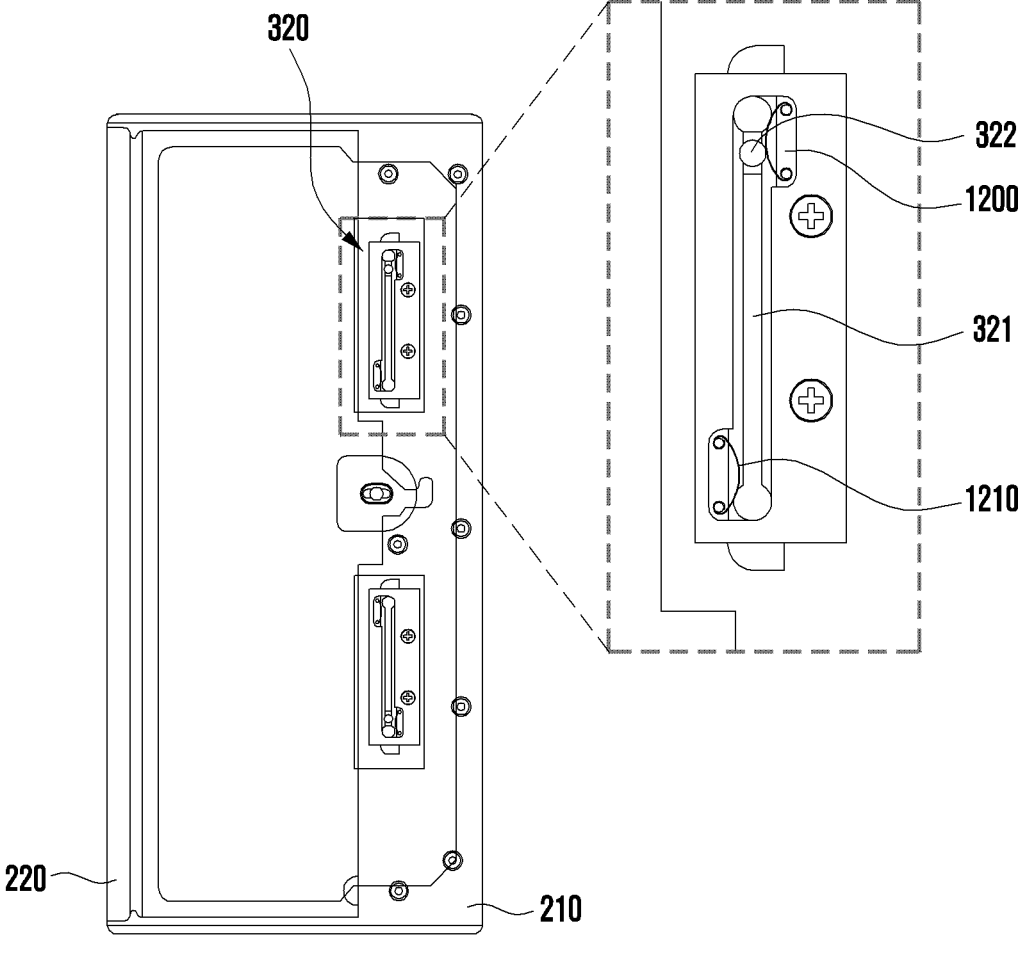
FIGS. 12A and 12B are views illustrating a driving restrictor according to various embodiments of the disclosure.
Figure 12B:
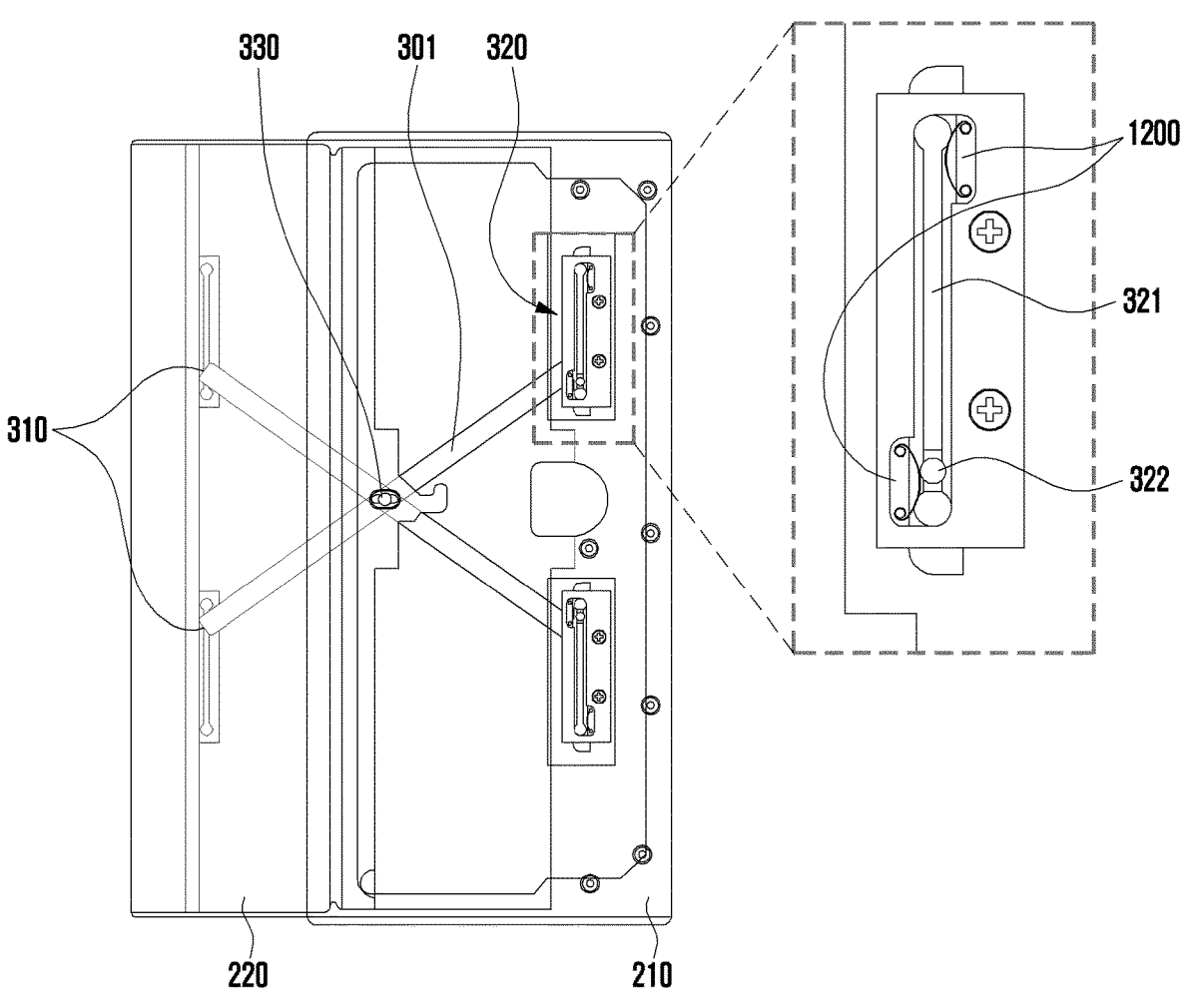

FIGS. 12A and 12B are views illustrating a driving restrictor according to various embodiments of the disclosure.

Figure 13A:
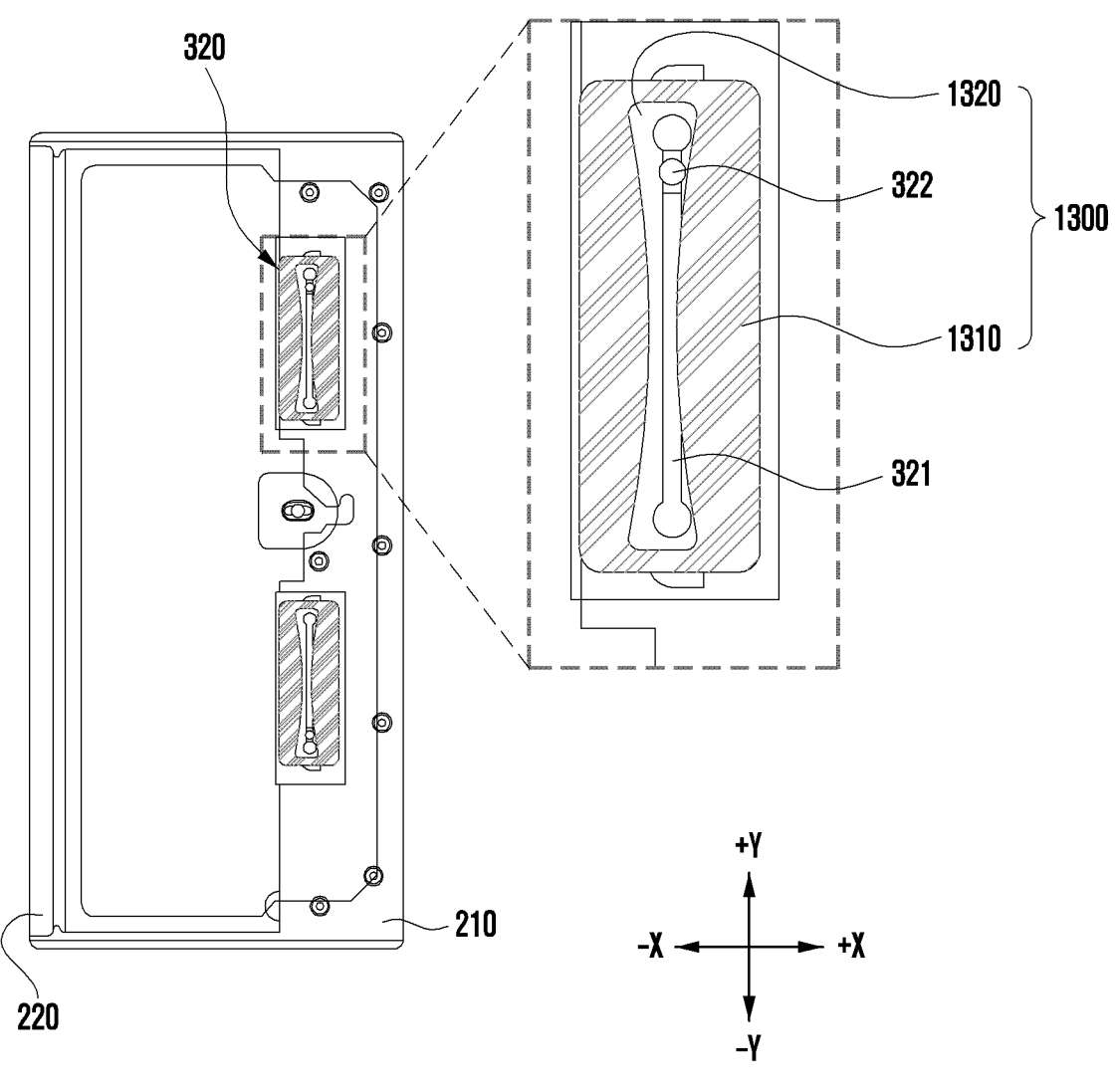
FIGS. 13A and 13B are views of a driving restrictor according to various embodiments of the disclosure.
Figure 13B:
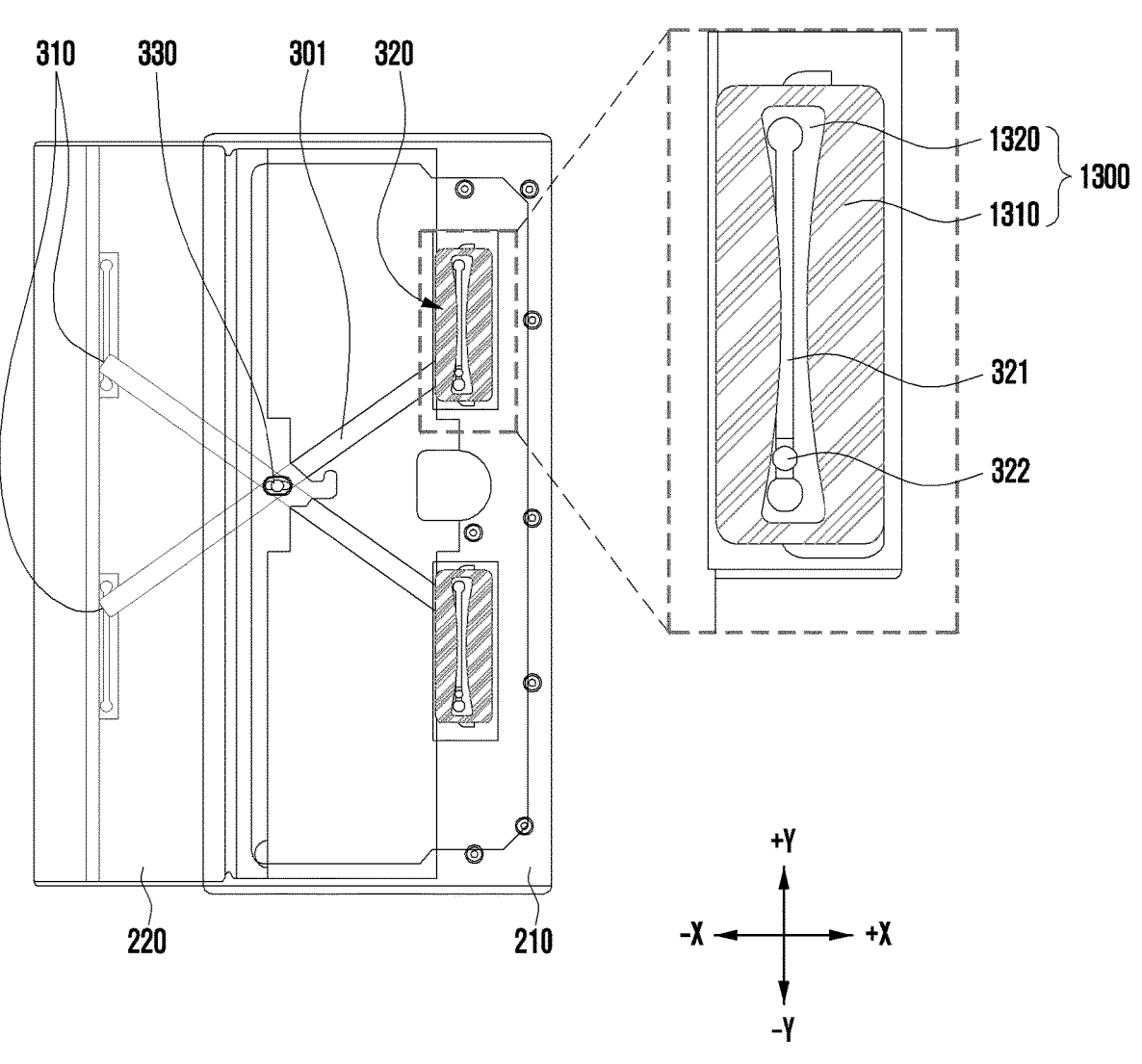

FIGS. 13A and 13B are views of a driving restrictor according to various embodiments of the disclosure.

Referring to FIGS. 12A, 12B, 13A and 13B, a gap may exist between the second slide rail 321 and the second slider 322 of the second connection portion 320. This gap may be an extra space required for the second slider 322 to slide while being inserted into the second slide rail 321. When moving occurs in the second connection portion 320 including the second slider 322 and the second slide rail 321, moving also occurs in the second housing 220 and the support member 250 connected to each other by the link member 301, resulting in a certain level of slide-movement of the second housing 220 relative to the first housing 210. In particular, if moving occurs when the electronic device 200 is in the closed or open state, usability may deteriorate.

For example, if moving occurs while a user touches the flexible display module 230 in the closed or open state, usability deteriorates.

According to various embodiments disclosed herein, the driving restrictors 1200 and 1300 may restrict sliding of the second slider 322 in the second slide rail 321. When the second slider 322 is fixed relative to the second slide rail 321, it is possible to restrict the link structure 300 from moving, thereby suppressing slide-movement. The driving restrictors 1200 and 1300 may be implemented in various ways.

For example, as illustrated in FIGS. 12A and 12B, a driving restrictor 1200 includes an elastic body 1210 disposed adjacent to either end of the second slide rail 321. The elastic body 1210 disposed at either end of the second slide rail 321 may protrude toward the second slide rail 321 to overlap a portion of the second slide rail 321. When the second slider 322 approaches to either end of the second slide rail 321, the corresponding elastic body 1210 may be pressed and deformed by the second slider 322. The second slider 322 may be fixed by the restoring force of the deformed elastic bodies 1210. When no external force greater than the restoring force of the elastic body 1210 is provided to components connected to the link structure 300 (e.g., the second housing 220 and the flexible display module 230 bonded to the support member 250), the second slider 322 may be maintained in the state of being fixed by the elastic body 1210. In the sliding motion in the electronic device 200, the second slider 322 may move along the second slide rail 321. When the electronic device 200 is in the open state (e.g., the state in FIG. 12B) and the closed state (e.g., the state in FIG. 12A), the second slider 322 may be provided at a position adjacent to either end of the second slide rail 321. Since the elastic bodies 1210 are disposed at both ends of the second slide rail 321, the position where the elastic bodies 1210 fix the second slider 322 may be a portion where the second slider is located when the electronic device 200 is in the open or closed state. Accordingly, the electronic device 200 may maintain the open or closed state. The shape, elasticity, and/or disposition position of the elastic bodies 1210 may be adjusted such that the elastic bodies 1210 fix the second slider 322 when the electronic device 200 is in the open or closed state.

As another example, as illustrated in FIGS. 13A and 13B, the driving restrictor 1300 may include a movable bracket 1310 installed to be movable with respect to the second slide rail 321 and a restricting rail 1320 provided on the movable bracket 1310. The movable bracket 1310 may be installed to be movable in a first direction (e.g., the X-axis direction in FIGS. 13A and 13B), which is the sliding direction in the electronic device 200, with respect to the second slide rail 321. For example, the movable bracket 1310 is installed to be movable in the first direction with respect to the second slide rail 321 by a rail structure (not illustrated). Referring to FIGS. 13A and 13B, the restricting rail 1320 provided on the movable bracket 1310 may be extend in a second direction (e.g., the Y-axis direction in FIGS. 13A and 13B) perpendicular to the first direction to correspond to the second slide rail 321, but may have a narrowed middle portion. The moving of the movable bracket 1310 may be synchronized with the sliding of the second housing 220 relative to the first housing 210. In an embodiment, when the second housing 220 slides relative to the first housing 210 by a certain level or more, the movable bracket 1310 may move relative to the second slide rail 321. For example, when the electronic device 200 approaches the closed state (e.g., the state illustrated in FIG. 13A) or an open state (e.g., the state illustrated in FIG. 13B), the movable bracket 1310 moves relative to the second slide rail 321. The movable bracket 1310 may be configured to come into contact with at least one of various relatively moving mechanical elements in the process in which the second housing 220 slides with respect to the first housing 210, and to move with respect to the second slide rail 321. When the movable bracket 1310 in contact with another mechanism moves with respect to the second slide rail 321 in the closed or open state of the electronic device 200, the sliding of the second slider 322 may be restricted by the staggered structure and the narrowed structure of the second slide rail 321 and the restricting rail 1320 of the movable bracket 1310. In an embodiment, the moving direction of the second housing 220 and the moving direction of the movable bracket 1310 may be opposite to each other. For example, referring to FIG. 13A, when the second housing 220 moves to the +X direction, the movable bracket 1310 moves to the −X direction. In addition, referring to FIG. 13B, when the second housing 220 moves to the −X direction, the movable bracket 1310 may move to the +X direction. The second slider 322 moving along the second slide rail 321 may also be partially inserted into the restricting rail 1320 provided in the movable bracket 1310. When the movable bracket 1310 moves with respect to the second slide rail 321 and the second slide rail 321 and the restricting rail 1320 are displaced, the position of the second slider 322 may be fixed by inclined surfaces of the restricting rail 1320. Since the middle portion of the restricting rail 1320 is narrowed, the second slider 322 pressed against the restricting rail 1320 may be restricted from moving in the extending direction of the second slide rail 321. Due to the shape of the restricting rail 1320, the movement of the second slider 322 may be restricted by the restricting rail 1320 at a portion adjacent to either end of the second slide rail 321. Accordingly, the electronic device 200 may maintain the closed or open state. When no external force capable of moving the movable bracket 1310 is provided to components connected to the link structure 300 (e.g., the second housing 220 and the flexible display module 230 bonded to the support member 250), the second slider 322 may be maintained in a state in which the position thereof is fixed by the restricting rail 1320.

FIGS. 14A, 14B, 15A, and 15B are views illustrating driving restrictors according to various embodiments of the disclosure.

Figure 14A:
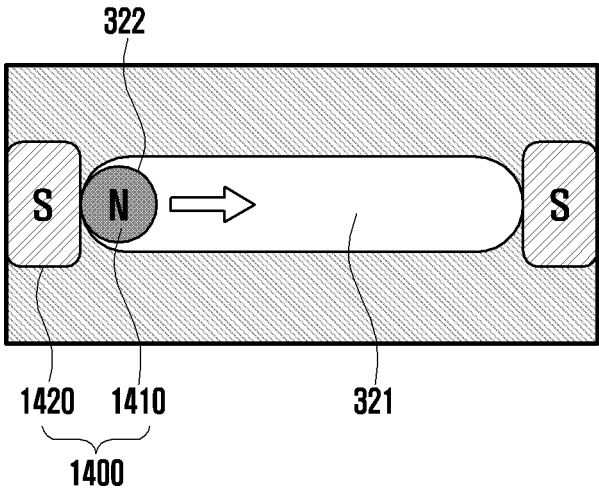
FIGS. 14A, 14B, 15A, and 15B are views illustrating driving restrictors according to various embodiments of the disclosure.
Figure 14B:
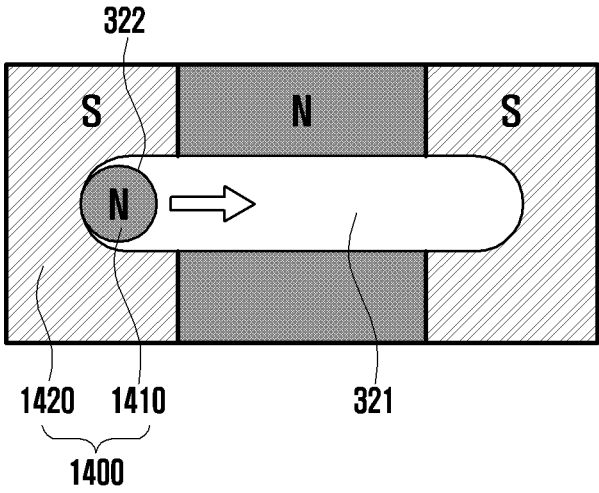

Polarities N and S illustrated in FIGS. 14A and 14B are only examples, and may be configured in various ways such that an attractive force or a repulsive force may act depending on the positional relationship between a magnetic element 1410 and a magnetic fixing element 1420.

Referring to FIGS. 14A and 14B, a driving restrictor 1400 may include a magnetic element 1410 and a magnetic fixing element 1420. The magnetic element 1410 may be made of a magnetic material. The magnetic element 1410 may be integrated with the second slider 322 or coupled to the second slider 322. The magnetic fixing element 1420 may be made of a magnetic material or may be configured to have a magnetic force depending on an electrical signal (e.g., an electromagnet). The magnetic fixing element 1420 may be disposed at either end of the second slide rail 321. The sliding of the second slider 322 relative to the second slide rail 321 may be restricted by the attraction between the magnetic element 1410 included in the second slider 322 and the magnetic fixing element 1420 disposed at either end of the second slide rail 321. Since the second slider 322 is located adjacent to either end of the second slide rail 321 when the electronic device is in the closed state (e.g., the state illustrated in FIG. 13A) or the open state (e.g., the state illustrated in FIG. 13B), the closed state and the open state of the electronic device may be maintained.

For example, as illustrated in FIG. 14A, the magnetic fixing element 1420 is configured with an electromagnet and disposed at either end of the second slide rail 321. By detecting that the electronic device is in the closed state or the open state by using various methods (e.g., with a sensor), an electric signal may be supplied to the magnetic fixing element 1420, so that the magnetic fixing element 1420 has a magnetic force. The sliding of the second slider 322 may be restricted depending on the attraction between the magnetic fixing element 1420 and the magnetic element 1410. In some embodiments, the magnetic element 1410 may be configured with an electromagnet, and both the magnetic element 1410 and the magnetic fixing element 1420 may be configured with an electromagnet.

As another example, as illustrated in FIG. 14B, the magnetic fixing element 1420 may be configured with a magnet, and either end of the second slide rail 321 and a portion other than either end of the second slide rail 321 may be made to have different polarities. At either end of the second slide rail 321, an attractive may act between the magnetic element 1410 and the magnetic fixing element 1420, and in the portion other than either end of the second slide rail 321, a repulsive force may act between the magnetic element 1410 and the magnetic fixing element 1420. At either end of the second slide rail 321, the sliding of the second slider 322 is restricted by the attraction between the magnetic element 1410 and the magnetic fixing element 1420, and in the portion other than either end of the second slide rail 322, the sliding of the second slider 322 may be induced depending on the repulsive force between the magnetic element 1410 and the magnetic fixing element 1420. Accordingly, the sliding operation of the electronic device may be performed more smoothly, and the electronic device may maintain the open state and the closed state.

Figure 15A:
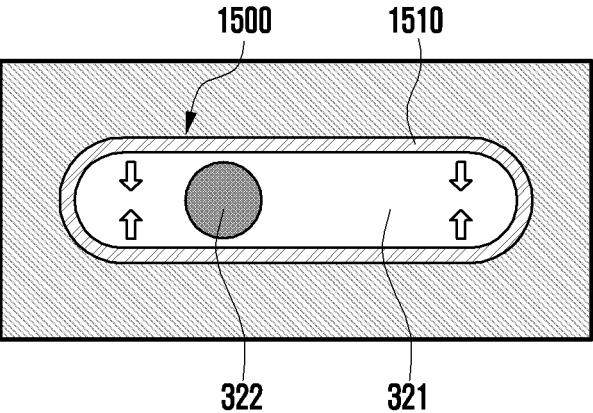
Figure 15B:
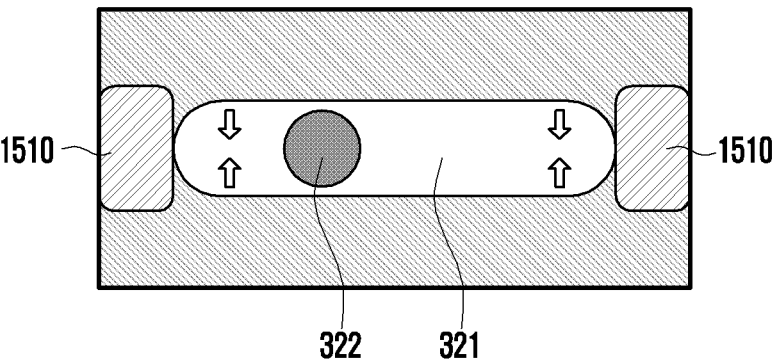

According to various embodiments, as illustrated in FIGS. 15A and 15B, the driving restrictor 1500 may include a shape memory alloy 1510. In an embodiment, as illustrated in FIG. 15A, the shape memory alloy 1510 may be disposed inside the second slide rail 321. In another embodiment, as illustrated in FIG. 15B, the shape memory alloy 1510 may be disposed at a position where the shape memory alloy 1510 is capable of adjusting the width of the second slide rail 321 depending on the deformation thereof. When a current is applied to the shape memory alloy 1510 and the temperature of the shape memory alloy 1510 reaches a deformation temperature, the shape memory alloy 1510 may be deformed into a memorized shape. Deformation of the shape memory alloy 1510 may reduce the width of the second slide rail 321 to restrict the sliding of the second slider 322. For example, a current is supplied to the shape memory alloy 1510 by detecting whether the electronic device is in the closed state or the open state by using various methods (e.g., with a sensor). Since the shape memory alloy 1510 is deformed and the width of the second slide rail 321 is reduced so that the second slider 322 may no longer slide, thereby allowing the electronic device to maintain the closed or open state.

In an embodiment, the driving restrictor 1500 may include an electroactive polymer (EAP) the shape of which is changed when electricity is applied thereto. The driving restrictor 1500 may be disposed such that the width of the second slide rail 321 is adjusted when electricity is applied to the driving restrictor 1500. When the driving restrictor 1500 is deformed in response to the application of electricity and the width of the second slide rail 321 is reduced, the second slider 322 may no longer slide with respect to the second slide rail 321, thereby allowing the electronic device to maintain the closed or open state.

In the foregoing description, the driving restrictor 1500 has been described as restricting the sliding of the second slider 322, but the above-described driving restrictor 1500 is also applicable to the first connection portion (the first slider or the first sliding rail).

Figure 16A:
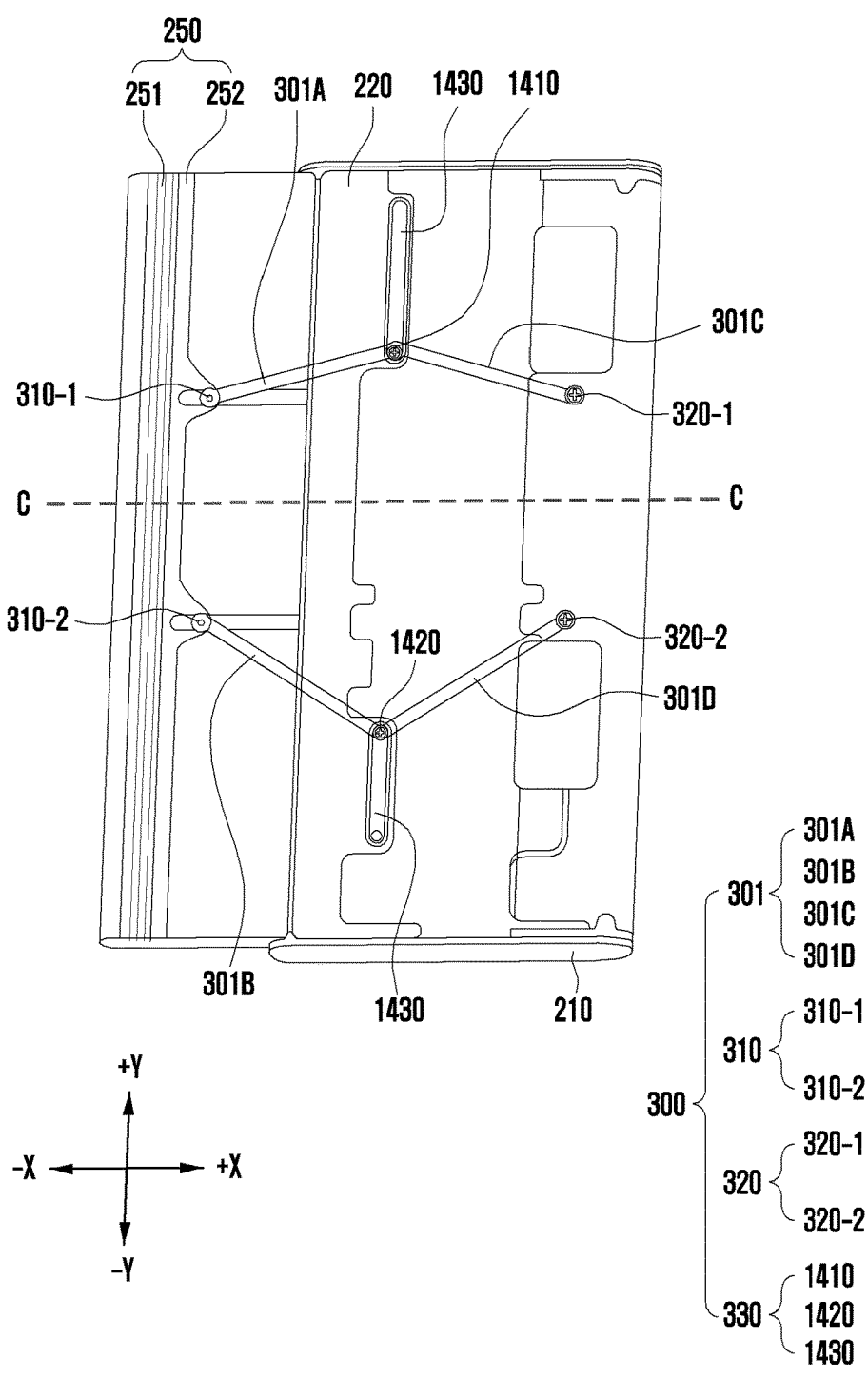
FIGS. 16A and 16B are views illustrating link members according to various embodiments of the disclosure.
Figure 16B:
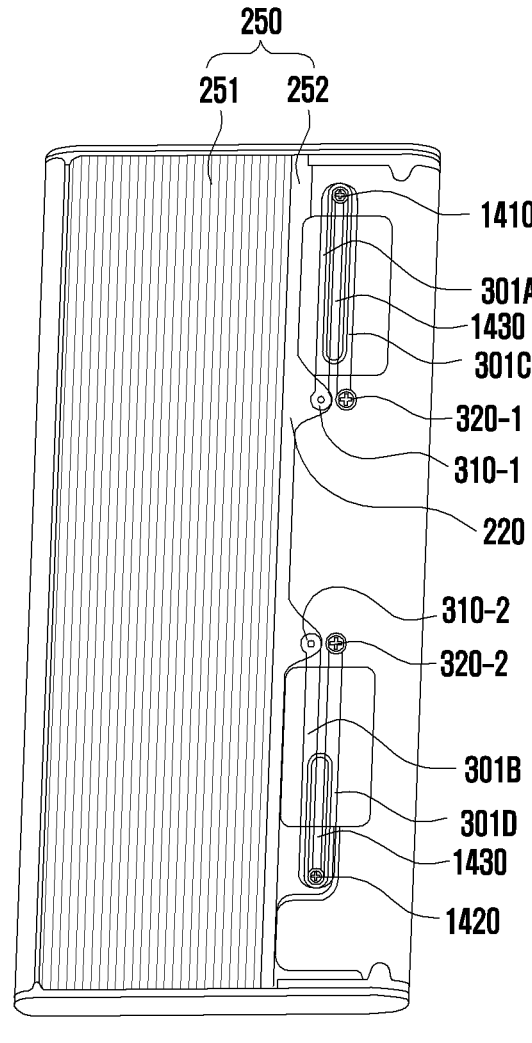
Figure 16B:
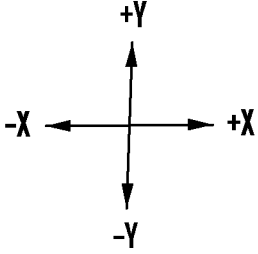

FIGS. 16A and 16B are views illustrating link members according to various embodiments of the disclosure.

The link structure 300 may connect the second housing 220 to the support member 250 in various ways to cause movements of the second housing 220 and the support member 250 to be synchronized with each other. Although it has been described above with reference to drawings that two link members (the first link member 301A and the second link member 301B) are in the form of crossing each other, the link structures 300 may also be disposed not to overlap each other.

Referring to FIGS. 16A and 16B, the link structure 300 may include a first link member 301A, a second link member 301B, a third link member 301C, and a fourth link member 301D. In addition, the link structure 300 may include a first connection portion 310 connecting the link member 301 to the support member 250, a second connection portion 320 connecting the link member 301 to the first housing 210, and a third connection portion 330 connecting the link member 301 to the second housing 220.

In an embodiment, the first connection portion 310 may include a $(1\text{-}1)^{th}$ connection portion 310-1 and a $(1\text{-}2)^{th}$ connection portion 310-2. The $(1\text{-}1)^{th}$ connection portion 310-1 may connect the first link member 301A to the support member 250, and the $(1\text{-}2)^{th}$ connection portion 310-2 may connect the second link member 301B to the support member 250. Referring to FIG. 16A, the $(1\text{-}1)^{th}$ connection portion 310-1 and the $(1\text{-}2)^{th}$ connection portion 310-2 may be disposed at different positions. For example, with respect to the central axis C of the electronic device 200 that is parallel to the first direction, which is the sliding direction of the second housing 220, the $(1\text{-}1)^{th}$ connection portion 310-1 is disposed in a third direction (e.g., the +Y direction in FIG. 16A), and the $(1\text{-}2)^{th}$ connection portion 310-2 is disposed in a fourth direction (e.g., the −Y direction in FIG. 16A) opposite to the third direction. In an embodiment, the $(1\text{-}1)^{th}$ connection portion 310-1 and the $(1\text{-}2)^{th}$ connection portion 310-2 may be disposed symmetrically with respect to the central axis C.

In an embodiment, the second connection portion 320 may include a $(2\text{-}1)^{th}$ connection portion 320-1 and a $(2\text{-}2)^{th}$ connection portion 320-2. The $(2\text{-}1)^{th}$ connection portion 320-1 may connect the third link member 301C to the first housing 210, and the $(2\text{-}2)^{th}$ connection portion 320-2 may connect the fourth link member 301D to the first housing 210. Referring to FIG. 16A, the $(2\text{-}1)^{th}$ connection portion 320-1 and the $(2\text{-}2)^{th}$ connection portion 320-2 may be disposed at different positions. For example, with respect to the central axis C of the electronic device 200, the $(2\text{-}1)^{th}$ connection portion 320-1 is disposed in a third direction (e.g., the +Y direction in FIG. 16A), and the second connection portion 320-2 may be disposed in a fourth direction (e.g., the −Y direction in FIG. 16A) opposite to the third direction. In an embodiment, the $(2\text{-}1)^{th}$ connection portion 320-1 and the $(2\text{-}2)^{th}$ connection portion 320-2 may be disposed symmetrically with respect to the central axis C.

In another embodiment, the third connection portion 330 may include a first link connection portion (i.e., magnetic element 1410), a second link connection portion (i.e., mag-netic fixing element 1420), and a third slide rail 1430. Referring to FIGS. 16A and 16B, the first link member 301A and the third link member 301C may be rotatably connected to each other by the first link connection portion (i.e., magnetic element 1410). The second link member 301B and the fourth link member 301D may be rotatably connected to each other by the second link connection portion (i.e., magnetic fixing element 1420). The third slide rail 1430 may be a rail provided in the second housing 220 or the support housing 240 in a second direction (e.g., the Y-axis direction in FIGS. 16A and 16B) perpendicular to the first direction (e.g., the X-axis direction in FIGS. 16A and 16B) which is the sliding direction in the electronic device 200. The first link connection portion (i.e., magnetic element 1410) and the second link connection portion (i.e., magnetic fixing element 1420) may be inserted into the third slide rail 1430 and may be slid in the second direction.

In the slide-in operation of the electronic device 200, while the first link connection portion (i.e., magnetic element 1410) and the second link connection portion (i.e., magnetic fixing element 1420) are slid in the third slide rail 1430, the first connection portion 310 and the second connection portion 320 may approach to each other. For example, an external force applied to the second housing 220 causes the first link connection portion (i.e., magnetic element 1410) and the second link connection portion (i.e., magnetic fixing element 1420) to slide, and the sliding of the first link connection portion (i.e., magnetic element 1410) and the second link connection portion (i.e., magnetic fixing element 1420) may cause the first connection portion 310 and the second connection portion 320 to approach to each other. Since the first connection portion 310 is provided on the support member 250 and the second connection portion 320 is provided on the first housing 210, the support member 250 may approach to the first housing 210. In this way, the external force applied to the second housing 220 may be converted into a driving force for causing the support member 250 to approach to the first housing 210 via the link structure 300.

In an embodiment, the first link member 301A and the third link member 301C may have the same length, and the second link member 301B and the fourth link member 301D may have the same length. Due to this length relationship, when the second housing 220 moves by a first distance, the link structure 300 may move the support member 250 by a second distance that corresponds to twice the first distance. When the second housing 220 moves by the first distance during the sliding operation in the electronic device, the support member 250 may move by the second distance that corresponds to twice the first distance (see FIG. 6). Therefore, the interlocking of the second housing 220 and the support member 250 by the link structure 300 may correspond to the relationship between the moving distance of the second housing 220 and the moving distance of the support member 250 in the sliding process.

In some embodiments, the link structure 300 may include only the first connection portion 310 and the third connection portion 330, and may not include the second connection portion 320. In other words, the link structure 300 may not be connected to the first housing 210. The link structure 300 may be connected to the support member 250 via the first connection portion 310 and may be connected to the second housing 220 via the third connection portion 330. Since the link structure 300 connects the support member 250 to the second housing 220, the sliding of the second housing 220 and the sliding of the support member 250 may be synchronized with each other.

An electronic device (e.g., the electronic device 101 in FIG. 1 or the electronic device 200 in FIG. 2A) according to various embodiments disclosed herein may include a first housing (e.g., the first housing 210 in FIG. 2A), a second housing (e.g., the second housing 220 of FIG. 2A) coupled to the first housing to be slidable in a first direction, a flexible display module (e.g., the flexible display module 230 in FIG. 2C) at least a portion of which is moved into or moved out of an accommodation space (e.g., the accommodation space 280 in FIG. 3A) in the electronic device following sliding of the second housing, a support member (e.g., the support member 250 in FIG. 2C) configured to support the flexible display module while being slid by the sliding of the second housing, and a link structure (e.g., the link structure 300 in FIG. 5B) configured to connect the first housing, the second housing, and the support member such that the sliding of the second housing and the sliding of the support member are synchronized with each other. The link structure may include a link member (e.g., the link member 301 in FIG. 5B), a first connection portion (e.g., the first connection portion 310 in FIG. 5B) configured to connect the link member to the support member, a second connection portion (e.g., the second connection portion 320 in FIG. 5B) configured to connect the link member to the first housing, and a third connection portion (e.g., the third connection portion 330 in FIG. 5B) configured to connect the link member to the second housing to be slidable or rotatable.

When the second housing slides with respect to the first housing by a first distance, the support member may slide with respect to the first housing by a second distance corresponding to twice the first distance, and the link member may be configured such that the distance between a portion where the link member is connected to the first connection portion and a portion where the link member is connected to the third connection portion is substantially equal to the distance between a portion where the link member is connected to the second connection portion and a portion where the link member is connected to the third connection portion.

The first connection portion of the link structure may include a first slide rail (e.g., the first slide rail 311 in FIG. 5B) provided on the support member in a second direction perpendicular to the first direction and a first slider (e.g., the first slider 312 in FIG. 7) inserted into the first slide rail and coupled to one end of the link member, and the second connection portion of the link structure may include a second slide rail (e.g., the second slide rail 321 in FIG. 5B) provided in the first housing in the second direction and a second slider (e.g., the second slider 322 in FIG. 5B) inserted into the second slide rail and coupled to the other end of the link member.

The support member may include a plurality of bars (e.g., the bars 251 in FIG. 3A) separated from each other, and the first slide rail may be provided on one of the plurality of bars included in the support member.

The third connection portion of the link structure may include an adjustment hole (e.g., the adjustment hole 1100 in FIG. 11) provided in the first direction such that a position where a middle portion of the link member is connected to the second housing is adjusted in the first direction.

The link member may include a first link member (e.g., the first link member 301A in FIG. 5B) and a second link member (e.g., the second link member 301B in FIG. 5B). The first connection portion may include a $(1\text{-}1)^{th}$ connection portion (e.g., the $(1\text{-}1)^{th}$ connection portion 310-1 in FIG. 5B) configured to connect the first link member to the support member and a $(1\text{-}2)^{th}$ connection portion (e.g., the $(1\text{-}2)^{th}$ connection portion 310-2 in FIG. 5B) configured to connect the second link member to the support member, the second connection portion may include a $(2\text{-}1)^{th}$ connection portion (e.g., the $(2\text{-}1)^{th}$ connection portion 320-1 in FIG. 5B) configured to connect the first link member to the first housing and a $(2\text{-}2)^{th}$ connection portion (e.g., the $(2\text{-}2)^{th}$ connection portion 320-2 in FIG. 5B) configured to connect the second link member to the first housing, and the third connection portion may rotatably connect the first link member and the second link member to each other. With respect to the central axis parallel to the first direction, the $(1\text{-}1)^{th}$ connection portion may be disposed in a third direction, and the $(1\text{-}2)^{th}$ connection portion may be disposed in a fourth direction opposite to the third direction, and with respect to the central axis, the $(2\text{-}1)^{th}$ connection portion may be disposed in the fourth direction, and the $(2\text{-}2)^{th}$ connection portion may be disposed in the third direction.

In addition, the second connection portion of the link structure may further include a connection bracket (e.g., the connection bracket 810 in FIG. 8B) coupled to the first housing, and the second slide rail of the second connection portion may be provided on the connection bracket.

The connection bracket may be made of a material having higher strength than the first housing.

The electronic device may further include a driving restrictor (e.g., the driving restrictor 1200, 1300, 1400, or 1500 in FIGS. 12A, 13A, 14A, and 15A) configured to restrict sliding of the second slider with respect to the second slide rail in a state in which the second housing is completely slid with respect to the first housing.

The driving restrictor may include elastic bodies disposed respectively adjacent to both ends of the second slide rail (e.g., the elastic bodies 1210 in FIG. 12A), and the elastic bodies may be pressed and deformed by the second slider.

In addition, the driving restrictor may include a movable bracket (e.g., the movable bracket 1310 in FIG. 13A) installed to be movable in the first direction with respect to the second slide rail, and a restricting rail (e.g., the restricting rail 1320 in FIG. 13A) provided in the movable bracket in the second direction to correspond to the second slide rail, the restricting rail having a shape that becomes narrower from the ends toward the center.

Following the sliding of the second housing relative to the first housing, the movable bracket may come into contact with a mechanical element included in the electronic device and may move in the first direction with respect to the second slide rail.

The sliding direction of the second housing and the moving direction of the movable bracket may be opposite to each other.

The driving restrictor may include a magnetic fixing element (e.g., the magnetic fixing element (i.e., magnetic fixing element 1420) in FIG. 14A) disposed on the second slide rail and a magnetic element disposed on the second slider (e.g., the magnetic element in FIG. 14A), and the sliding of the second slider may be restricted by a magnetic force acting between the magnetic fixing element and the magnetic element.

The driving restrictor may include a shape memory alloy (e.g., the shape memory alloy 1510 in FIG. 15A) disposed on the second slide rail, and depending on a current applied to the shape memory alloy, the shape memory alloy may be deformed to change the size of the second slide rail, thereby restricting the sliding of the second slider.

The link member may include a first link member (e.g., the first link member 301A in FIG. 16A), a second link member (e.g., the second link member 301B in FIG. 16A), and a third link member (e.g., the third link member 301C in FIG. 16A), and a fourth link member (e.g., the fourth link member 301D in FIG. 16A). The first connection portion may include a $(1\text{-}1)^{th}$ connection portion (e.g., the $(1\text{-}1)^{th}$ connection portion 310-1 in FIG. 16A) configured to connect the first link member to the support member and a $(1\text{-}2)^{th}$ connection portion (e.g., $(1\text{-}2)^{th}$ connection portion 310-2 in FIG. 16A) configured to connect the second link member to the support member, the second connection portion includes a $(2\text{-}1)^{th}$ connection portion (e.g., the $(2\text{-}1)^{th}$ connection portion 320-1 in FIG. 16A) configured to connect the third link member to the first housing and a $(2\text{-}2)^{th}$ connection portion (e.g., the $(2\text{-}2)^{th}$ connection portion 320-2 in FIG. 16A) configured to connect the fourth link member to the first housing, and the third connection portion may include a first link connection portion (e.g., the first link connection portion (i.e., magnetic element 1410) in FIG. 16A) configured to rotatably connect the first link member to the third link member to each other, and a second link connection portion (e.g., the second link connection portion (i.e., magnetic fixing element 1420) in FIG. 16A) configured to rotatably connect the second link member to the fourth link member to each other.

In addition, the third connection portion may include a third slide rail (e.g., the third slide rail 1430 in FIG. 16A) provided in the second housing in a second direction perpendicular to the first direction, and the first link connection portion and the second link connection portion may be inserted into and slid in the third slide rail.

The electronic device may further include a support housing (e.g., the support housing 240 in FIG. 2C) coupled to the second housing. The third connection portion may include a third slide rail provided on the support housing in a second direction perpendicular to the first direction, and the first link connection portion and the second link connection portion may be inserted into and slid in the third slide rail.

Furthermore, with respect to the central axis parallel to the first direction, the $(1\text{-}1)^{th}$ connection portion and the $(2\text{-}1)^{th}$ connection portion may be disposed in a third direction, and with respect to the central axis, the $(1\text{-}2)^{th}$ connection portion and the $(2\text{-}2)^{th}$ connection portion may be disposed in a fourth direction opposite to the third direction.

An electronic device (e.g., the electronic device 101 in FIG. 1 or the electronic device 200 in FIG. 2A) according to various embodiments disclosed herein may include a first housing (e.g., the first housing 210 in FIG. 2A), a second housing (e.g., the second housing 220 of FIG. 2A) coupled to the first housing to be slidable in a first direction, a flexible display module (e.g., the flexible display module 230 in FIG. 2C) at least a portion of which is moved into or moved out of an accommodation space (e.g., the accommodation space 280 in FIG. 3A) in the electronic device following sliding of the second housing, a support member (e.g., the support member 250 in FIG. 2C) configured to support the flexible display module while sliding by a second distance corresponding to twice a first distance when the second housing slides by the first distance, and a link structure (e.g., the link structure 300 in FIG. 5B) configured to connect the first housing, the second housing, and the support member such that the sliding of the second housing and the sliding of the support member are synchronized with each other. The link structure may include a link member (e.g., the link member 301 in FIG. 5B), a first connection portion (e.g., the first connection portion 310 in FIG. 5B) configured to connect the link member to the support member, a second connection portion (e.g., the second connection portion 320 in FIG. 5B)

configured to connect the link member to the first housing, and a third connection portion (e.g., the third connection portion 330 in FIG. 5B) configured to connect the link member to the second housing to be slidable or rotatable. The link member may be configured such that the distance between a portion connected to the first connection portion and a portion connected to the third connection portion is substantially equal to the distance between a portion connected to the second connection portion and a portion connected to the third connection portion.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a first housing;
   a second housing coupled to the first housing to be movable in a first direction with respect to the first housing;
   a flexible display at least a portion of which is moved into or moved out of an accommodation space in the electronic device following movement of the second housing;
   a support member configured to support the flexible display while being moved by the movement of the second housing; and
   a link structure connected with the first housing, the second housing, and the support member,
   wherein the link structure comprises:
      a first link member,
      a second link member disposed to cross the first link member, and
      a connection portion connecting the first link member and the second link member rotatably at a point where the first link member and the second link member cross,
   wherein one end of the first link member is connected to the support member and the other end of the first link member is connected to the first housing,
   wherein one end of the second link member is connected to the support member and the other end of the second link member is connected to the first housing,
   wherein the connection portion is located at an edge of the second housing such that a portion of the first link member and a portion of the second link member are connected to the edge of the second housing through the connection portion.

2. The electronic device of claim 1,
   wherein, in case that the second housing slides with respect to the first housing by a first distance, the support member slides with respect to the first housing by a second distance corresponding to twice the first distance,
   wherein the first link member is configured such that a distance between a portion where the first link member is connected to the support member and a portion where the first link member is connected to the third-connection portion is substantially equal to a distance between a portion where the first link member is connected to the first housing and a portion where the first link member is connected to the connection portion,
   wherein the second link member is configured such that a distance between a portion where the second link member is connected to the support member and a portion where the second link member is connected to the connection portion is substantially equal to a distance between a portion where the second link member is connected to the first housing and a portion where the second link member is connected to the connection portion.

3. The electronic device of claim 1,
wherein the link structure further comprises;
a first slide rail provided on the support member in a second direction perpendicular to the first direction,
a first slider inserted into the first slide rail and coupled to one end of the first link member or the other end of the second link member,
a second slide rail provided in the first housing in the second direction, and
a second slider inserted into the second slide rail and coupled to another end of the first link member or the one end of the second link member.

4. The electronic device of claim 1,
wherein, with respect to a central axis parallel to the first direction, the one end of the first link member is disposed in a third direction, and the one end of the second link member is disposed in a fourth direction opposite to the third direction, and
wherein, with respect to the central axis, the other end of the first link member is disposed in the fourth direction, and the other end of the second link member is disposed in the third direction.

5. The electronic device of claim 3,
wherein the other end of the first link member or the one end of the second link member of the link structure further comprises a connection bracket coupled to the first housing,
wherein the second slide rail is provided on the connection bracket, and
wherein the connection bracket is made of a material having higher strength than the first housing.

6. The electronic device of claim 3, further comprising a driving restrictor configured to restrict sliding of the second slider with respect to the second slide rail in a state in which the second housing is completely slid with respect to the first housing.

7. The electronic device of claim 6,
wherein the driving restrictor comprises elastic bodies disposed respectively adjacent to both ends of the second slide rail, and
wherein the elastic bodies are configured to be pressed and deformed by the second slider.

8. The electronic device of claim 6, wherein the driving restrictor comprises:
a movable bracket installed to be movable in the first direction with respect to the second slide rail, and
a restricting rail provided in the movable bracket in the second direction to correspond to the second slide rail, the restricting rail having a shape that becomes narrower from the ends toward the center.

9. The electronic device of claim 8,
wherein following the sliding of the second housing with respect to the first housing, the movable bracket comes into contact with a mechanical element comprised in the electronic device and moves in the first direction with respect to the second slide rail, and
wherein the sliding direction of the second housing and the moving direction of the movable bracket are opposite to each other.

10. The electronic device of claim 6,
wherein the driving restrictor comprises:
a magnetic fixing element disposed on the second slide rail, and
a magnetic element disposed on the second slider, and
wherein the sliding of the second slider is restricted by a magnetic force acting between the magnetic fixing element and the magnetic element.

11. The electronic device of claim 6,
wherein the driving restrictor comprises a shape memory alloy disposed on the second slide rail, and
wherein depending on a current applied to the shape memory alloy, the shape memory alloy is deformed to change the size of the second slide rail, thereby restricting the sliding of the second slider.

12. An electronic device comprising:
a first housing;
a second housing coupled to the first housing to be movable in a first direction with respect to the first housing;
a flexible display at least a portion of which is moved into or moved out of an accommodation space in the electronic device following movement of the second housing;
a support member configured to support the flexible display while being slid by the movement of the second housing; and
a link structure connected with the first housing, the second housing, and the support member,
wherein the link structure comprises:
a first link member,
a second link member,
a third link member rotatably connected to the first link member through a first connection portion, and
a fourth link member rotatably connected to the second link member through a second connection portion,
wherein one end of the first link member is connected to the support member and the other end of the first link member is connected to the first connection portion,
wherein one end of the second link member is connected to the support member and the other end of the second link member is connected to the second connection portion,
wherein one end of the third link member is connected to the first connection portion and the other end of the third link member is connected to the first housing, and
wherein one end of the fourth link member is connected to the second connection portion and the other end of the fourth link member is connected to the first housing.

13. The electronic device of claim 12,
wherein the link structure further comprises a third slide rail provided in the second housing in a second direction perpendicular to the first direction, and
wherein the first connection portion and the second connection portion are inserted into and slid in the third slide rail.

14. The electronic device of claim 12, further comprising a support housing coupled to the second housing,
wherein the link structure further comprises a third slide rail provided on the support housing in a second direction perpendicular to the first direction,
wherein the first connection portion and the second connection portion are inserted into and slid in the third slide rail, wherein, with respect to a central axis parallel to the first direction, the one end of the first link member and the other end of the third link member are disposed in a third direction, and wherein with respect to the central axis, the one end of the second link member and the other end of the fourth link member are disposed in a fourth direction opposite to the third direction.

* * * * *